(12) United States Patent
Yoshinari et al.

(10) Patent No.: US 10,338,470 B2
(45) Date of Patent: Jul. 2, 2019

(54) PHOTOSENSITIVE LAMINATE, TRANSFER MATERIAL, PATTERNED PHOTOSENSITIVE LAMINATE, METHOD FOR MANUFACTURING THE SAME, TOUCH PANEL, AND IMAGE DISPLAY DEVICE

(71) Applicant: FUJIFILM Corporation, Tokyo (JP)

(72) Inventors: Shinichi Yoshinari, Fujinomiya (JP); Morimasa Sato, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 47 days.

(21) Appl. No.: 15/269,414

(22) Filed: Sep. 19, 2016

(65) Prior Publication Data

US 2017/0003593 A1 Jan. 5, 2017

Related U.S. Application Data

(63) Continuation of application No. PCT/JP2015/058201, filed on Mar. 19, 2015.

(30) Foreign Application Priority Data

Mar. 20, 2014 (JP) .................................. 2014-058054

(51) Int. Cl.
*G03F 7/038* (2006.01)
*G03F 7/16* (2006.01)
(Continued)

(52) U.S. Cl.
CPC .......... *G03F 7/0957* (2013.01); *G03F 7/0047* (2013.01); *G03F 7/027* (2013.01);
(Continued)

(58) Field of Classification Search
None
See application file for complete search history.

(56) References Cited

U.S. PATENT DOCUMENTS 4,318,975 A * 3/1982 Kuznetsov ............... G03F 7/11
430/160
5,024,919 A * 6/1991 Yamauchi ............... G03F 7/095
430/156
(Continued)

FOREIGN PATENT DOCUMENTS

JP 06-324207 * 11/1994 ............... G02B 5/20
JP H 10-111573 A 4/1998
(Continued)

OTHER PUBLICATIONS

International Search Report for PCT/JP2015/058201 dated Jun. 9, 2015 [PCT/ISA/210].
(Continued)

*Primary Examiner* — Martin J Angebranndt
(74) *Attorney, Agent, or Firm* — Sughrue Mion, PLLC

(57) ABSTRACT

An object of the invention is to provide a photosensitive laminate in which two or more layers can be collectively patterned, a transfer material, a patterned photosensitive laminate, a method for manufacturing the patterned photosensitive laminate, a touch panel, and an image display device. According to the invention, there are provided a photosensitive laminate in which a first resin layer, an interlayer, and a second resin layer are laminated on a support in this order, at least one of the first resin layer or the second resin layer includes 20 mass % or greater of inorganic particles, and exposure sensitivity of the second resin layer is higher than that of the first resin layer, a transfer material, a patterned photosensitive laminate, a method for manufacturing the patterned photosensitive laminate, a touch panel, and an image display device.

8 Claims, 7 Drawing Sheets

(51) Int. Cl.
  *G03F 7/30* (2006.01)
  *G03F 7/09* (2006.01)
  *G06F 3/044* (2006.01)
  *G03F 7/095* (2006.01)
  *G03F 7/004* (2006.01)
  *G03F 7/027* (2006.01)

(52) U.S. Cl.
  CPC ............ *G03F 7/038* (2013.01); *G03F 7/0388* (2013.01); *G03F 7/095* (2013.01); *G03F 7/16* (2013.01); *G03F 7/30* (2013.01); *G06F 3/044* (2013.01); *G06F 2203/04103* (2013.01); *G06F 2203/04111* (2013.01)

(56) References Cited

U.S. PATENT DOCUMENTS

| | | | |
|---|---|---|---|
| 6,238,840 B1* | 5/2001 | Hirayama | G03F 7/038 430/280.1 |
| 6,605,412 B2* | 8/2003 | Iwata | G03F 7/091 430/270.1 |
| 7,150,955 B2 | 12/2006 | Sato et al. | |
| 7,303,856 B2 | 12/2007 | Sato et al. | |
| 2005/0025946 A1 | 2/2005 | Sato et al. | |
| 2005/0037281 A1 | 2/2005 | Sato et al. | |
| 2005/0227090 A1* | 10/2005 | Yoshioka | G02B 1/11 428/447 |
| 2012/0068292 A1* | 3/2012 | Ikeda | G02B 13/006 257/432 |
| 2014/0100301 A1* | 4/2014 | Lin | C08L 83/04 522/8 |
| 2015/0109252 A1* | 4/2015 | Kanna | G06F 3/044 345/174 |
| 2015/0116270 A1* | 4/2015 | Kanna | G06F 3/0412 345/174 |
| 2015/0251393 A1* | 9/2015 | Kanna | G06F 3/044 428/334 |
| 2015/0349030 A1* | 12/2015 | Ono | H01L 51/5284 257/40 |
| 2016/0231650 A1* | 8/2016 | Tanabe | G03F 7/038 |
| 2017/0115778 A1* | 4/2017 | Kanna | B32B 7/02 |
| 2017/0157899 A1* | 6/2017 | Kanna | C08F 2/50 |
| 2017/0220154 A1* | 8/2017 | Gotoh | B32B 27/00 |
| 2017/0334165 A1* | 11/2017 | Aritoshi | B32B 7/02 |
| 2017/0364177 A1* | 12/2017 | Toyooka | B32B 27/00 |
| 2018/0001606 A1* | 1/2018 | Kanna | B32B 27/20 |
| 2018/0203548 A1* | 7/2018 | Toyooka | B32B 7/02 |

FOREIGN PATENT DOCUMENTS

| | | | | |
|---|---|---|---|---|
| JP | 2004-045490 A | | 2/2004 | |
| JP | 2005-202066 A | | 7/2005 | |
| JP | 2007-086268 A | | 4/2007 | |
| JP | 2013-174787 | * | 9/2013 | ............ G02B 1/11 |
| JP | 2013-218010 A | | 10/2013 | |
| JP | 2014-071306 A | | 4/2014 | |
| WO | 2014/034768 A1 | | 3/2014 | |

OTHER PUBLICATIONS

Written Opinion for PCT/JP2015/058201 dated Jun. 9, 2015 [PCT/ISA/237].
Office Action dated Mar. 28, 2017, from the Japanese Patent Office in counterpart Japanese Application No. 2014-058054.
International Preliminary Report on Patentability dated Sep. 29, 2016, from the International Bureau in counterpart International Application No. PCT/JP2015/058201.

* cited by examiner

PHOTOSENSITIVE LAMINATE, TRANSFER MATERIAL, PATTERNED PHOTOSENSITIVE LAMINATE, METHOD FOR MANUFACTURING THE SAME, TOUCH PANEL, AND IMAGE DISPLAY DEVICE

The present application is a continuation of PCT/JP2015/58201 filed on Mar. 19, 2015 and claims priority under 35 U.S.C. § 119 of Japanese Patent Application No. 58054/2014 filed on Mar. 20, 2014.

BACKGROUND OF THE INVENTION

1. Field of the Invention

The present invention relates to a photosensitive laminate to be used in a protective material with a decorative material or a refractive index adjusting layer, or the like. The invention relates to a transfer material for manufacturing the photosensitive laminate. The invention relates to a patterned photosensitive laminate and a method for manufacturing the patterned photosensitive laminate. The invention relates to a touch panel and an image display device that have the photosensitive laminate.

2. Description of the Related Art

Recently, touch panel-type input devices are arranged on a surface of a liquid crystal device or the like in electronic apparatuses such as mobile phones, car navigation devices, personal computers, ticket machines, and bank terminals. In this case, while an instruction image displayed on an image display area of a liquid crystal device is referred to, a finger, a touch pen, or the like is brought into contact with a portion in which this instruction image is displayed, so as to input information corresponding to the instruction image.

Regarding such input devices (touch panels), there are a resistance film type, an electrostatic capacitance type, and the like. A resistance film-type input device has defects of having a small operational temperature range and weakness with elapse of time, because of the structure obtained by pressing and shortening a film in a two-sheet structure of a film and glass. In contrast, an electrostatic capacitance-type input device has an advantage in that a light transmissive conductive film may be formed on one substrate. For example, there is a type of electrostatic capacitance-type input device, in which electrode patterns extend in directions intersecting each other and detect electrostatic capacitance between electrodes changing when a finger or the like is brought into contact therewith, such that an input position is detected.

In such an electrostatic capacitance-type input device, in order to allow a drawing circuit of the display device or the like not to be visible to a user or to improve appearance, decoration is performed by forming a decorative material into a frame shape surrounding an information display with which a finger, a touch pen, or the like is brought into contact. For example, JP2013-218010A discloses a front surface protective plate for a display device in which a base material, a light shielding layer exhibiting a white-type color, an oxygen barrier layer, and a backing layer are laminated in this order as a method for forming a decorative material, and discloses repeating patterning for each layer so as to perform the lamination.

The decorative material can be formed by using a transfer material. A transfer material is used for manufacturing a printed wiring substrate or the like, and for example, JP2005-202066A discloses a photosensitive transfer sheet in which a first photosensitive layer including a binder, a polymerizable compound, and a photopolymerization initiator, a barrier layer including a polymerizable compound, and a second photosensitive layer including a binder, a polymerizable compound, and a photopolymerization initiator are laminated on a support, in this order, in which the second photosensitive layer has comparatively higher photosensitivity than the first photosensitive layer.

JP1998-111573A (JP-H10-111573A) discloses a photosensitive resin laminate obtained by laminating a first photosensitive resin layer containing a predetermined vinyl copolymer, a predetermined photopolymerizable monomer, a photopolymerizable monomer containing two or more ethylenically unsaturated double bonds, and a photopolymerization initiator and a second photosensitive resin layer containing a predetermined vinyl copolymer, a predetermined photopolymerizable monomer, a photopolymerizable monomer containing two or more ethylenically unsaturated double bonds, and a photopolymerization initiator on a support, in this order.

SUMMARY OF THE INVENTION

JP2013-218010A has a problem in that an alignment operation at the time of lamination becomes complicated, since patterning is repeated for each of the light shielding layer, the oxygen barrier layer, and the backing layer, and lamination is performed. JP2005-202066A and JP1998-111573A (JP-H10-111573A) do not disclose a transfer material used for a printed wiring substrate in order to form a decorative material. If a resin layer is made to contain a pigment in order to form a decorative material, there is a problem that patterning becomes inconvenient, the pigment comes out from a side surface of the transfer material at the time of development, and if the first photosensitive layer and the second photosensitive layer are applied without providing an interlayer, the photosensitive layers may coalesce with each other, such that intended characteristics are not obtained.

An object of the invention is to provide a photosensitive laminate in which two or more layers can be patterned at one time. Particularly, an object of the invention is to provide a photosensitive laminate having satisfactory patterning properties, in which peeling of layers is suppressed, and complicated alignment of the first layer and the second layer is alleviated.

An object of the invention is to provide a transfer material for manufacturing the photosensitive laminate. An object of the invention is to provide a photosensitive laminate which is patterned and a method for manufacturing the patterned photosensitive laminate. An object of the invention is to provide a touch panel and an image display device which have the photosensitive laminate.

As a result of diligent research in order to solve the problems described above, the present inventors have found that the problems described above can be solved by manufacturing a photosensitive laminate in which a first resin layer, an interlayer, and a second resin layer are laminated on a support in this order, 20 mass % or greater of inorganic particles are included in at least one of the first resin layer or the second resin layer, and the exposure sensitivity of the second resin layer is higher than that of the first resin layer, so as to complete the invention.

Specifically, the invention has the following configurations.

<1> A photosensitive laminate, comprising: a support; and a first resin layer, an interlayer, and a second resin layer which are laminated on the support in this order, in which at least one of the first resin layer or the second resin layer includes 20 mass % or greater of inorganic particles, and in which exposure sensitivity of the second resin layer is higher than that of the first resin layer.

<2> The photosensitive laminate according to <1>, in which the second resin layer contains a photopolymerization initiator and a polymerizable compound, and in which the first resin layer, the interlayer, and the second resin layer are soluble to an aqueous alkali solution.

<3> The photosensitive laminate according to <1> or <2>, in which the interlayer contains a photopolymerization initiator and a polymerizable compound.

<4> The photosensitive laminate according to any one of <1> to <3>, in which the first resin layer contains a photopolymerization initiator and a polymerizable compound.

<5> The photosensitive laminate according to any one of <1> to <4>, in which the first resin layer and the second resin layer are decorative layers, refractive index adjusting layers, or protective layers.

<6> The photosensitive laminate according to any one of <1> to <5>, in which the inorganic particles are made of rutile titanium dioxide, carbon black, or zirconium oxide.

<7> The photosensitive laminate according to any one of <1> to <6>, in which the interlayer is manufactured by using an aqueous coating liquid, an alcohol coating liquid, or a mixed coating liquid of water and alcohol.

<8> The photosensitive laminate according to any one of <1> to <7>, in which the interlayer contains polyvinyl alcohol.

<9> A transfer material, comprising: a temporary support; and a second resin layer, an interlayer, and a first resin layer which are laminated on the temporary support in this order, in which at least one of the first resin layer or the second resin layer includes 20 mass % or greater of inorganic particles, and in which exposure sensitivity of the second resin layer is higher than that of the first resin layer.

<10> The transfer material according to <9>, in which the second resin layer contains a photopolymerization initiator and a polymerizable compound, and in which the first resin layer, the interlayer, and the second resin layer are soluble to an aqueous alkali solution.

<11> The transfer material according to <9> or <10>, in which the interlayer contains a photopolymerization initiator and a polymerizable compound.

<12> The transfer material according to any one of <9> to <11>, in which the first resin layer contains a photopolymerization initiator and a polymerizable compound.

<13> The transfer material according to any one of <9> to <12>, in which the first resin layer and the second resin layer are decorative layers, refractive index adjusting layers, or protective layers.

<14> The transfer material according to any one of <9> to <13>, in which the inorganic particles are made of rutile titanium dioxide, carbon black, or zirconium oxide.

<15> The transfer material according to any one of <9> to <14>, in which the interlayer is manufactured by using an aqueous coating liquid, an alcohol coating liquid, or a mixed coating liquid of water and alcohol.

<16> The transfer material according to any one of <9> to <15>, in which the interlayer contains polyvinyl alcohol.

<17> The photosensitive laminate according to any one of <1> to <8>, obtained by transferring the transfer material according to any one of <9> to <16> onto the support such that the first resin layer is on the support side and removing the temporary support.

<18> A method for manufacturing a patterned photosensitive laminate, comprising: hardening a predetermined patterned area in the second resin layer of the photosensitive laminate according to any one of <1> to <8>, and removing an unhardened portion by treating the photosensitive laminate obtained above with a developer.

<19> A patterned photosensitive laminate obtained by the method according to <18>.

<20> A touch panel comprising: a hardened product of the photosensitive laminate according to any one of <1> to <8>, <17>, or <19>.

<21> An information display device comprising: the touch panel according to <20>.

According to the photosensitive laminate of the invention, the patterning of 2 or more layers can be performed at one time, patterning properties are satisfactory, the peeling of the second layer can be suppressed, and complicated alignment of the first layer and the second layer can be alleviated. The transfer material of the invention is useful for manufacturing the photosensitive laminate. The patterned photosensitive laminate of the invention is useful for manufacturing a touch panel or the like. According to the invention, it is possible to provide a touch panel and an image display device which have the photosensitive laminate.

DESCRIPTION OF THE PREFERRED EMBODIMENTS

Figure 1:
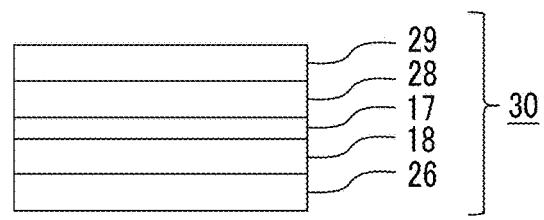
FIG. 1 is a sectional view schematically illustrating an example of a transfer material of the invention.

Hereinafter, a photosensitive laminate, a transfer material, a patterned photosensitive laminate, a method for manufacturing the patterned photosensitive laminate, a touch panel, and an image display device according to the invention are described in detail.

The description of configuration requirements described below is based on represented embodiments of the invention, but the invention is not limited to the embodiments. In this specification, the numerical values described by using the expression "to" mean a scope including numerical values described before and after the expression "to" as a lower limit and an upper limit.

Unless described otherwise, a refractive index in each layer according to the specification means a refractive index in a wavelength of 550 nm.

With respect to a film thickness in each layer according to the invention, a level difference thereof can be measured by a surface roughness measuring device, in a state in which a coating film is cut by a cutting tool or the like, and a cross section of the film is exposed. As the surface roughness measuring device, a commercially available surface roughness measuring device can be used, but measuring can be performed by using a stylus-type film thickness meter P-10 manufactured by KLA-Tencor Corporation.

[Photosensitive Laminate and Transfer Material]

In the photosensitive laminate according to the invention, a first resin layer, an interlayer, and a second resin layer are laminated on a support in this order, at least one of the first resin layer or the second resin layer includes 20 mass % or greater of inorganic particles, and exposure sensitivity of the second resin layer is higher than that of the first resin layer. In the transfer material according to the invention, a second resin layer, an interlayer, and a first resin layer are laminated on a temporary support, in this order, the first resin layer and/or the second resin layer includes 20 mass % or greater of inorganic particles, and exposure sensitivity of the second resin layer is higher than that of the first resin layer. According to this configuration, patterning of two or more layers can be collectively performed, and particularly, patterning properties are satisfactory, the peeling of the second layer can be suppressed, and complicated alignment of the first layer and the second layer which is required in a printing method or the like can be alleviated. Though the invention does not adhere to theories, it is considered that, if a photosensitive material which includes a lot of inorganic particles and has decreased transmission efficiency of ultraviolet light to an underlayer is formed in a multilayer configuration, only a surface layer is sufficiently photocured, and a strong coating layer is formed, even if the hardening of the underlayer is insufficient, satisfactory patterning characteristics can be provided.

Hereinafter, a preferable embodiment of the photosensitive laminate according to the invention is described.

<First Resin Layer and Second Resin Layer>

The photosensitive laminate and the transfer material according to the invention have first resin layers, interlayers, and second resin layers. At least one of the first resin layer or the second resin layer includes 20 mass % or greater of inorganic particles, and exposure sensitivity of the second resin layer is higher than exposure sensitivity of the first resin layer. The photosensitivity means properties in which a chemical change of a substance occurs by irradiation with light and pattern forming becomes possible by using a developer such as an aqueous alkali solution. A laminate means a structure formed with plural layers on a support such as a glass substrate or a plastic film. A first resin layer may be curable or non-curable, but preferably curable, and more preferably photocurable. The second resin layer is preferably photocurable.

In a first embodiment, the first resin layer, the interlayer, and the second resin layer in the photosensitive laminate according to the invention can be used as a decorative material. In this case, the photosensitive laminate according to the invention can be used as a substrate with a decorative material. In the case where the photosensitive laminate according to the invention is used as a substrate with a decorative material, the first resin layer can be used as a white coloration layer (also referred to as a "white material layer"), and the second resin layer can be used as a light shielding layer.

In a second embodiment, a first resin layer, an interlayer, and a second resin layer in a photosensitive laminate according to the invention can be used as a protective layer with a refractive index adjusting layer (also referred to as an "overcoat layer with an index matching layer"). In this case, the first resin layer can be used as a refractive index adjusting layer (index matching layer), and the second resin layer can be used as an overcoat layer.

A photosensitive laminate according to the invention can be used for another use in addition to the above.

(Materials of First Resin Layer and Second Resin Layer)

Materials of the first resin layer and the second resin layer are not particularly limited, as long as at least one layer includes 20 mass % or greater of inorganic particles.

The inorganic particles may be included in both of the first resin layer and the second resin layer, may be included in the first resin layer only, or may be included in the second resin layer only. In the case where the photosensitive laminate according to the invention is used as a substrate with a decorative material, inorganic particles are preferably included in both of the first resin layer and the second resin layer. In the case where the first resin layer, the interlayer, and the second resin layer in the photosensitive laminate according to the invention are used as a protective layer with a refractive index adjusting layer, inorganic particles may be included in the first resin layer and may not included in the second resin layer.

Examples of the inorganic particles include metal fine particles, metallic oxide fine particles, carbon black, and a high refractive index transparent pigment.

As the metal fine particles, fine particles of metal such as iron, aluminum, gold, and silver can be used.

Semimetal such as B, Si, Ge, As, Sb, and Te is included in the metal of metallic oxide particles. As the metallic oxide particles, oxide particles including atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, Te, Si, and Nb are preferable, titanium oxide, titanium complex oxide, zinc oxide, zirconium oxide, indium/tin oxide, and antimony/tin oxide are more preferable, titanium oxide, titanium complex oxide, and zirconium oxide are even more preferable, and titanium oxide, and zirconium oxide are particularly preferable. In the case where the first resin layer, the interlayer, and the second resin layer are used as decorative materials, titanium dioxide is most preferable. In the case where the first resin layer, the interlayer, and the second resin layer are used as protective layers with refractive index adjusting layers, zirconium oxide or titanium dioxide is most preferable. As titanium dioxide, a rutile type having a high refractive index is particularly preferable. Since these metallic oxide particles decrease the provision of dispersion stability or photocatalytic activity, surfaces may be treated with an organic material.

In view of transparency of the resin composition, an average primary particle diameter of the inorganic particles is preferably 1 nm to 200 nm and particularly preferably 3 nm to 80 nm Here, the average primary particle diameter of the particles refers to an arithmetic average of particle diameters of 200 arbitrary particles measured by an electron microscope. In the case where the shape of the particles is not circular, the longest side is set to be a diameter.

Examples of the high refractive index transparent pigment include zirconium oxide and titanium dioxide of which a particle diameter is 50 nm or less.

The inorganic particles may be used singly or two or more types thereof may be used in combination.

Specifically, for example, in the case where titanium dioxide as inorganic particles is contained in the first resin layer, and carbon black is contained in the second resin layer, the first resin layer can function as a white coloration layer, the second resin layer can function as a light shielding layer, and the photosensitive laminate can be used as a substrate with a decorative material. In the case where the high refractive index transparent pigment is contained in the first resin layer, the first resin layer can function as a refractive index adjusting layer, the second resin layer can function as an overcoat layer, and the photosensitive laminate can be used as a protective layer with a refractive index adjusting layer.

As the inorganic particles that are used for the refractive index adjusting layer, particles having a higher refractive index than that of a resin composition consisting of a material except for the particles are preferable. Specifically, particles of which a refractive index to light having a wavelength of 400 nm to 750 nm is 1.50 or greater are more preferable, particles of which a refractive index is 1.70 or greater are even more preferable, and particles of which a refractive index is 1.90 or greater are particularly preferable.

Here, the expression "a refractive index to light having a wavelength of 400 nm to 750 nm is 1.50 or greater" means that an average refractive index to light having a wavelength in the range described above is 1.50 or greater, and all refractive indexes to light having the wavelength in the range described above do not have to be 1.50 or greater. The average refractive index is a value obtained by dividing the sum of measured values of the refractive index to each light having the wavelength in the range described above by the number of measured points.

The content of the inorganic particles in the resin layer including the inorganic particles is 20 mass % or greater, is preferably 20 mass % to 70 mass %, and more preferably 30 mass % to 60 mass %.

The first resin layers and the second resin layers in the photosensitive laminate and the transfer material according to the invention preferably include resins (preferably a soluble alkali resin), polymerizable compounds, polymerization initiators, or polymerization initiating systems. In view of easily performing development when a photosensitive laminate is patterned, the first resin layers and the second resin layers preferably soluble to aqueous alkali solutions. Though additives and the like are used, but the invention is not limited thereto.

Resins (also referred to as binders or polymers) used in the first and second resin layers or other additives are not particularly limited, as long as the resins or the additives do not depart from the gist of the invention.

As the resins (also referred to as binders or polymers) used in the first and second resin layers, alkaline soluble resins are preferable. As the alkaline soluble resin, polymers disclosed in paragraph "0025" disclosed in JP2011-95716A, paragraphs "0033" to "0052" of JP2010-237589A can be used. Specific resins used in the first resin layer and the second resin layer include polymer compounds disclosed in paragraphs "0061" to "0089" of JP2005-202066A, or polymer compounds disclosed in paragraphs "0028" to "0073" of JP2008-146018A.

As the polymerizable compound contained in the first and second resin layers, polymerizable compounds disclosed in paragraphs "0023" and "0024" of JP4098550B. As specific polymerizable compounds used in the first resin layer and the second resin layer, commercially available products can be used. Examples thereof include a monomers DPHA (manufactured by Nippon Kayaku Co., Ltd.), NK OLIGO UA-32P (manufactured by Shin-Nakamura Chemical Co., Ltd.), and VISCOAT V#802 (manufactured by Osaka Organic Chemical Industry Ltd.).

As the polymerization initiators or the polymerization initiating systems, polymerization initiators or polymerization initiating systems disclosed in paragraphs "0031" to "0042" of JP2011-95716A can be used. As the polymerization initiator or the polymerization initiating systems, commercially available products can be used. Examples thereof include IRGACURE 907, IRGACURE 2959, and IRGACURE 379EG (all are manufactured by BASF Japan Ltd.), and DETX-S (manufactured by Nippon Kayaku Co., Ltd.).

Additives may be used in the first resin layer and the second resin layer. Examples of the additives include surfactants disclosed in paragraph "0017" of JP4502784B and paragraphs "0060" to "0071" of JP2009-237362A, thermal polymerization inhibitors disclosed in paragraph "0018" of JP4502784B, and other additives disclosed in paragraphs "0058" to "0071" of JP2000-310706A. Specific examples include fluorine-based compounds (MEGAFACE F-556 manufactured by DIC Corporation), and fluorescent brightening agents (Tinopal OB, manufactured by BASF Japan Ltd.).

As solvents when the photosensitive film is manufactured by coating, solvents disclosed in paragraphs "0043" and "0044" of JP2011-95716A can be used. Specific examples include propylene glycol monomethyl ether acetate, and methyl ethyl ketone.

(Physical Properties of First Resin Layer)

According to the invention, the first resin layer has lower exposure sensitivity than the second resin layer. The first resin layer may have lower exposure sensitivity than the second resin layer. The first resin layer may be non-photosensitive, but preferably photosensitive in view of prevention of film peeling of the second resin layer.

In the case where the first resin layer is used as the refractive index adjusting layer, the refractive index of the first resin layer is preferably 1.60 to 1.78, more preferably 1.60 to 1.75, and even more preferably 1.60 to 1.70.

In the case where the first resin layer functions as a white coloration layer, the film thickness of the first resin layer is preferably 1 μm to 110 μm, more preferably 15 μm to 60 μm, and even more preferably 25 μm to 50 μm.

In the case where the first resin layer functions as a refractive index adjusting layer, the film thickness of the first resin layer is preferably 55 nm to 110 nm, more preferably 55 nm to 105 nm, and even more preferably 60 nm to 100 nm.

(Physical Properties of Second Resin Layer)

According to the invention, the second resin layer is arranged on an interlayer described below, and exposure sensitivity of the second resin layer is higher than that of the first resin layer.

If the description is made with reference to a negative photosensitive resin layer, the exposure sensitivity can be evaluated by changing exposure amounts of ultraviolet rays in various ways and examining an exposure amount in which the thickness of a coating film after development remains by 90% or greater. With respect to the exposure amount at this point, as a numerical value is lower, sensitivity of the film is higher. Even if a non-photosensitive resin layer is irradiated with a lot of ultraviolet rays, photocuring reactions do not proceed, and the coating film does not remain in the development. Therefore, it is considered that a non-photosensitive resin layer has lower sensitivity than all resin layers having photosensitivity.

An ultraviolet irradiation amount required for remaining 90% or greater of the film thickness of the second resin layer is ½ or less of an ultraviolet irradiation amount required in the first resin layer. The sensitivity is preferably high, more preferably ⅓ or less, and even more preferably ⅕ or less.

In the case where the second resin layer is used as a protective layer in a protective layer with a refractive index adjusting layer, a refractive index of the second resin layer is preferably 1.50 to 1.53, more preferably 1.50 to 1.52, and even more preferably 1.51 to 1.52.

In the case where the second resin layer is used as a light shielding layer, the film thickness of the second resin layer is preferably 1 μm to 50 μm, more preferably 1 μm to 30 μm, and even more preferably 1 μm to 25 μm, since sufficient surface protection properties can be exhibited when a transparent protective layer of a touch panel is formed by using the second resin layer.

In the case where the second resin layer functions as a protective layer in a protective layer with a refractive index adjusting layer, the film thickness of the second resin layer is preferably 1 μm to 10 μm, more preferably 1 μm to 8 μm, and even more preferably 3 μm to 8 μm.

<Interlayer>

According to the invention, in view of preventing the mixture of components at the time of being coated with plural layers or at the time of preservation after coating, an interlayer is further included between the first resin layer and the second resin layer.

The interlayer shows low oxygen permeability, and thus is preferably dispersed or dissolved in water or an aqueous alkali solution, and the interlayer that can be selected appropriately from layers well-known in the art can be manufactured preferably by using an aqueous coating liquid, an alcohol coating liquid, or a mixed coating liquid of water and alcohol.

For example, the interlayer can be formed by using resins such as a polyvinyl alcohol-based resin, a polyvinyl pyrrolidone-based resin, a cellulose-based resin, an acrylamide-based resin, a polyethylene oxide-based resin, gelatin, a vinyl ether-based resin, a polyamide resin, and copolymers thereof. Among them, a combination of polyvinyl alcohol and polyvinyl pyrrolidone is particularly preferable.

If necessary, additives such as a surfactant, a photopolymerization initiator (for example, IRGACURE 2959, manufactured by BASF Japan Ltd.), and a polymerizable monomer (for example, LIGHT ACRYLATE (3EG-A, manufactured by Kyoeisha Chemical Co., Ltd.)) may be added to the interlayer.

In the case where the first resin layer, the interlayer, and the second resin layer are used as a decorative material, the film thickness of the interlayer is preferably 0.1 μm to 10 μm, more preferably 0.5 μm to 5 μm, and even more preferably 1 μm to 3 μm.

In the case where the first resin layer, the interlayer, and the second resin layer are used as a refractive index adjusting layer or a protective layer, the film thickness of the interlayer is preferably 0.05 μm to 5 μm, more preferably 0.1 μm to 3 μm, and even more preferably 0.1 μm to 1 μm.

<Support>

As the support used in the photosensitive laminate according to the invention, various supports may be used, but the support is preferably a film support, and a support without optical distortion or a support with high transparency is preferable. In the photosensitive laminate according to the invention, the support preferably has total light transmittance of 80% or greater. Here, the total light transmittance can be measured by a commercially available spectrophotometer comprising an integrating sphere, and can be measured by a spectrophotometer UV-2100 manufactured by Shimadzu Corporation.

Specific materials in the case where a support is a film support include polyethylene terephthalate (PET), polyethylene naphthalate, polycarbonate (PC), triacetylcellulose (TAC), and a cycloolefine polymer (COP). The support may be glass or the like.

In the photosensitive laminate according to the invention, the support is preferably selected from glass, TAC, PET, PC, COP, or a silicone resin (here, a silicone resin or polyorganosiloxane in this specification is not limited to a narrow sense represented by a structural unit formulation of $R_2SiO$, but also includes a silsesquioxane compound represented by a structural unit formulation of $RSiO_{1.5}$), and preferably consists of glass, a cycloolefine polymer, or a silicone resin.

The silicone resin preferably includes a cage-shaped polyorganosiloxane as a main component and more preferably includes a basket-shaped silsesquioxane as a main component. The main component of a composition or a layer means a component occupying 50 mass % or greater of the composition or the layer. As the silicone resin or the substrate including a silicone resin, compounds disclosed in JP4142385B, JP4409397B, JP5078269B, JP4920513B, JP4964748B, JP5036060B, JP2010-96848A, JP2011-194647A, JP2012-183818A, JP2012-184371A, and JP2012-218322A, and the contents disclosed in these publications are incorporated in the invention.

Various functions may be added to the surface of the support. Specific examples thereof include an antireflection layer, an antiglare layer, a phase difference layer, a view angle improving layer, a scratch resistance layer, a self-repairing layer, an antistatic layer, an antifouling layer, an anti-electromagnetic wave layer, and a conductive layer.

In the photosensitive laminate according to the invention, the support may have a conductive layer on the surface of the support. As the conductive layer, layers disclosed in JP2009-505358A can be preferably used.

The support preferably has at least one of a scratch resistance layer or an antifouling layer.

With respect to the photosensitive laminate according to the invention, in the case where the support is a film support, the film thickness is preferably 40 µm to 200 µm, more preferably 40 µm to 150 µm, and particularly preferably 50 µm to 120 µm. When the support is a glass substrate, the film thickness is preferably 0.1 mm to 1.0 mm and more preferably 0.3 mm to 0.7 mm.

In order to increase adhesiveness of a coloration layer due to a laminate in a transfer step, a surface treatment may be performed on a contactless surface of a support (front surface plate) in advance. As the surface treatment, it is preferable to perform a surface treatment (silane coupling treatment) using a silane compound. A silane coupling agent preferably has a functional group that interacts with a photosensitive resin. Pure water shower washing is performed, for example, by spraying a silane coupling agent (0.3 mass % aqueous solution of N-β(aminoethyl)γ-aminopropyltrimethoxysilane, Product name: KBM603, manufactured by Shin-Etsu Chemical Co., Ltd.) using a shower for 20 seconds. Thereafter, reaction is performed by heating. A heating tank may be used, or a reaction may be promoted by support preheating of a laminator.

<Temporary Support>

The transfer material according to the invention has a temporary support.

As the temporary support, materials that have flexibility and that do not extremely generate deformation, shrinkage, or extension under pressurization or under pressurization and heating can be used. Examples of the temporary support include a polyethylene terephthalate film, a cellulose triacetate film (TAC film), a polystyrene film, and a polycarbonate film. Among these, a biaxially oriented polyethylene terephthalate film is particularly preferable.

The thickness of the temporary support is not particularly limited, and is generally in the range of 5 µm to 200 µm, and particularly preferably in the range of 10 µm to 150 µm, in view of easy handling, versatility, and the like.

The temporary support may be transparent, or may contain dyed silicon, alumina sol, a chromium salt, and a zirconium salt.

Conductivity may be provided to the temporary support by methods disclosed in JP2005-221726A.

<Protective Film>

According to the invention, it is preferable to further provide a protective film (protection peeling layer) and the like on the surface of the second resin layer.

As the protective film, films disclosed in paragraphs "0083" to "0087" and "0093" of JP2006-259138A can be used.

<Conductive Layer>

According to the invention, a conductive layer may be further provided on the second resin layer.

As the conductive layer, layers disclosed in JP2009-505358A can be preferably used. The configuration or the shape of the conductive layer is described in descriptions of a first transparent electrode pattern, a second transparent electrode pattern, and another conductive element in the description of the touch panel according to the invention below. According to the invention, the conductive layer preferably includes indium (including an indium-containing compound such as ITO or an indium alloy).

FIG. 1 illustrates an example of a preferable configuration of a transfer material according to the invention. FIG. 1 is a diagram schematically illustrating a transfer material 30 according to the invention, in which a temporary support 26, a second resin layer 18, an interlayer 17, and a first resin layer 28, and a cover film 29 are laminated to be adjacent to each other in this order.

[Method for Manufacturing Transfer Material]

The transfer material according to the invention can be manufactured in a step of forming a second resin layer on a temporary support, a step of forming an interlayer on the second resin layer, and a step of forming a first resin layer on the interlayer.

Figure 4:
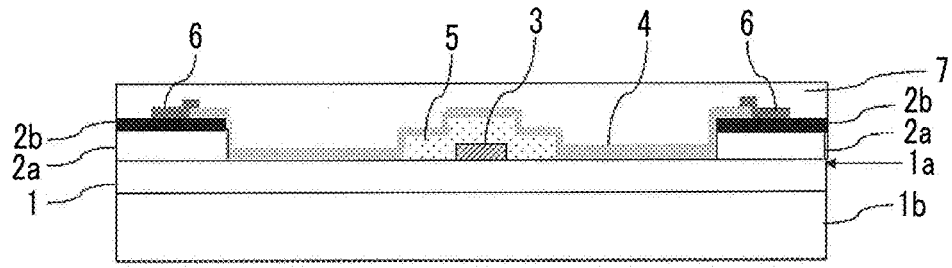
FIG. 4 is a sectional view schematically illustrating another example of a configuration of a touch panel of the invention.
Figure 5:
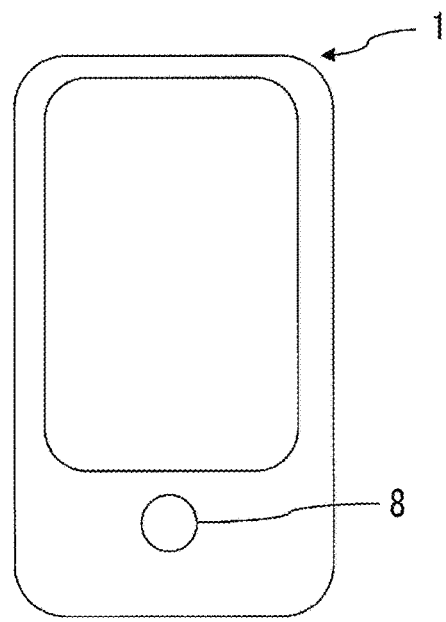
FIG. 5 is a plan view illustrating an example of a front surface plate on which first and second transparent electrode patterns are formed.

In the touch panel having an opening 8 in the configuration of FIG. 5, if a white coloration layer 2a or a light shielding layer 2b, or the like illustrated in FIG. 4 is formed by using a film transfer material, even on a support (front surface plate) having an opening, the support is not contaminated due to leakage of a resist component from the opening Particularly, since the resist component does not extrude from a glass end of the white coloration layer 2a or the light shielding layer 2b in which light shielding patterns have to be formed to the boundary of the front surface plate as close as possible, a touch panel having an advantage of forming a thin layer or reducing a weight can be manufactured in a simple step without contaminating the back side of the support.

A method of manufacturing the transfer material is not particularly limited, but for example, the transfer material can be manufactured by steps disclosed in paragraphs "0064" to "0066" of JP2005-3861A. For example, the film transfer material can be manufactured by a method disclosed in JP2009-116078A.

Examples of the method for manufacturing the transfer material include a method of coating a temporary support with a resin composition and drying the resin composition so as to form respective layers.

Here, the film transfer material may form at least two layers of the white coloration layer or the light shielding layer, as coloration layers. Meanwhile, in the case where after a film transfer material having a temporary support and a white coloration layer is transferred on a support, the temporary support is removed, and further the film transfer material at least including a temporary support and a light shielding layer is transferred to the white coloration layer, a layer in which at least one of the white coloration layer or the light shielding layer is formed may be used as the coloration layer. In the former case, as the transfer material according to the invention, a layer in which the light shielding layer and the white coloration layer are laminated on the temporary support in this order can be used. In this case, a white decorative material and a light shielding material can be provided on a (glass) support at one time, and thus it is preferable in processes.

In the transfer material that can be used in the invention, an additional layer may be formed to an extent of not departing from the gist of the invention. Before the first and second resin layers are formed, a thermoplastic resin layer may be formed by coating.

As a method of coating a temporary support with a coating liquid for the first and second resin layers and a coating liquid for forming the interlayer, well-known coating methods can be used. For example, the layers can be formed by applying such a coating liquid by using a coating machine such as a spinner, a whirler, a roller coater, a curtain coater, a knife coater, a wire bar coater, and an extruder and drying the coating liquid.

(Solvent)

The composition for forming respective layers of the transfer material can be very appropriately prepared by using a solvent together with respective components included the composition.

Examples of the solvent include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkylesters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid alkyl esters such as methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate), and alkyl 2-oxypropionic acid esters such as methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methyl propionate, and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate.

Examples of the solvent include ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether acetate, propylene glycol monoethyl ether acetate, and propylene glycol propyl ether acetate.

Examples of the solvent include ketones, for example, methyl ethyl ketone, methyl isobutyl ketone, cyclohexanone, 2-heptanone, and 3-heptanone.

Examples of the solvent include aromatic hydrocarbons, for example, toluene, and xylene; and alcohols, for example, methanol, ethanol, isopropanol, N-propanol, N-butanol, isobutanol, t-butanol, and propylene glycol monomethyl ether.

Among these, methyl ethyl ketone, methyl isobutyl ketone, xylene, cyclohexanone, propylene glycol monomethyl ether, propylene glycol monomethyl ether acetate, and the like are suitable.

The solvent may be used singly or two or more types thereof may be used in combination.

[Method for Manufacturing Photosensitive Laminate]

The method for manufacturing the photosensitive laminate according to the invention is not particularly limited. The photosensitive laminate may be formed by respectively applying the first resin layer and the second resin layer or may be manufactured by a method of transferring the layers from the transfer material according to the invention. Specifically, examples of the method for manufacturing the photosensitive laminate according to the invention include a method selected from a method of forming the photosensitive laminate by coating a support with a first resin layer, an interlayer, and a second resin layer, in this order and a method of transferring a second resin layer, an interlayer, and a first resin layer to a support, from a transfer material on which the second resin layer, the interlayer, and the first resin layer are laminated on the temporary support in this order and removing the temporary support.

<Method for Manufacturing Photosensitive Laminate by Coating Method>

As a method of coating a coating liquid for the first and second resin layers and a coating liquid for the interlayer, well-known coating methods can be used. For example, the photosensitive laminate can be formed by applying these coating liquids by using a coating machine such as a spinner, a whirler, a roller coater, a curtain coater, a knife coater, a wire bar coater, and an extruder and drying the coating liquids.

<Method for Manufacturing Photosensitive Laminate by Transfer Method>

Figure 2A:
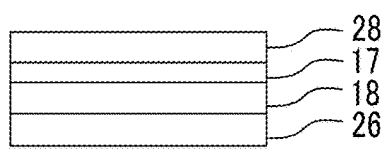
FIG. 2A is a sectional view schematically illustrating an example of a transfer material of the invention and FIG. 2B is a sectional view schematically illustrating an example of a configuration of a photosensitive laminate of the invention.
Figure 2B:
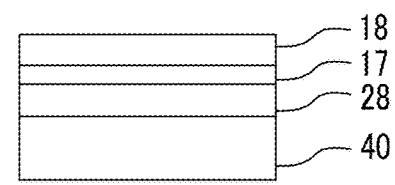

As a method for manufacturing a photosensitive laminate by a transfer method, a method of manufacturing the transfer material as described above, laminating the manufactured transfer material on the support, and removing a temporary support can be performed so as to manufacture the photosensitive laminate. That is, the photosensitive laminate illustrated in FIG. 2B can be manufactured by laminating the transfer material according to the invention in which the temporary support 26, the second resin layer 18, the interlayer 17, and the first resin layer 28 are laminated to be adjacent to each other in this order as illustrated in FIG. 2A on the support and removing the temporary support.

(Laminating Method)

The transferring (bonding) of the first and second resin layers on the surface of the support is performed by overlapping the first resin layer on the surface of the support and performing pressurizing and heating. In the bonding, well-known laminators such as a laminator, a vacuum laminator, and an automatic cut laminator that can increase productivity can be used.

As the laminating method, a method in which air bubbles are not introduced between the support and the decorative material by accurately transferring a punched decorative material on the support in a sheet type is preferable, in view of increasing yield.

Specifically, examples thereof preferably include the use of a vacuum laminator.

Examples of the device used in the laminating (continuous type/sheet type) include V-SE340aaH manufactured by Climb Products.

Examples of the vacuum laminator device include vacuum laminators manufactured by Takanoseiki Corporation or FVJ-540R or FV700 manufactured by Taisei Laminator Co., Ltd.

If a step of laminating an additional support on the opposite side of the colorant of the temporary support is included before the transfer material is bonded to the support, a preferable effect in which air bubbles are not introduced at the time of laminating may be obtained. At this point, the additional support used is not particularly limited, but examples thereof include the following:

polyethylene terephthalate, polycarbonate, triacetylcellulose, and cycloolefine polymer. The film thickness can be selected in the range of 50 μm to 200 μm.

(Step of Removing Temporary Support)

A method for manufacturing a film transfer material preferably includes a step of removing the temporary support from the transfer material bonded to the support.

(Other Steps)

The method for manufacturing the transfer material may have other steps such as a post exposure step.

The post exposure step may be performed in a surface direction on a side of the white coloration layer and the light shielding layer which comes into contact with the substrate, in a surface direction on a side of the white coloration layer and the light shielding layer which does not come into contact with the transparent substrate, or in both surface directions.

As the examples of the exposure step, the development step, the step of removing the thermoplastic resin layers and the interlayer, and the other steps, methods disclosed in paragraphs "0035" to "0051" of JP2006-23696A can be appropriately used in the invention.

[Method for Manufacturing Patterned Photosensitive Laminate]

The method for manufacturing the patterned photosensitive laminate according to the invention includes a step of hardening a predetermined patterned area in the second resin layer of the photosensitive laminate according to the invention, in which the first resin layer, the interlayer, and the second resin layer are laminated on the support in this order and a step of treating the obtained photosensitive laminate with a developer so as to remove an unhardened portion. The patterned photosensitive laminate obtained by the method is in the scope of the invention. According to the method for manufacturing the patterned photosensitive laminate according to the invention, patterning of two or more layers can be collectively performed.

In the case where the photosensitive laminate is formed by using the transfer material, the step of exposing the patterned photosensitive laminate according to the invention may be performed before the step of removing the temporary support, or may be performed after the temporary support is removed. However, in order to prevent the polymerization inhibition due to oxygen in the air, it is desirable to perform the exposure before the temporary support is removed.

For example, the method for manufacturing the patterned photosensitive laminate according to the invention can be performed by a step of arranging a predetermined mask on the second resin layer side of the photosensitive laminate, exposing the second resin layer side via the interlayer and the first resin layer from the upper side of the mask, and subsequently performing development by a developer. Here, a light source of the exposure can be appropriately selected as long as the light source can apply light in a wavelength range (for example, 365 nm or 405 nm) that can harden the second resin layer side, the interlayer, and the first resin layer. Specifically, examples thereof include an ultrahigh pressure mercury lamp, a high pressure mercury lamp, and a metal halide lamp. The exposure amount is generally about 5 mJ/cm$^2$ to 20,000 mJ/cm$^2$ and preferably about 10 mJ/cm$^2$ to 6,000 mJ/cm$^2$.

The developer is not particularly limited, but well-known developers such as developers disclosed in JP1993-72724A (JP-H05-72724A) can be used. The developer preferably causes the photosensitive resin layer to show dissolution-type development behaviors, and preferably includes a compound having a pKa of 7 to 13 in the concentration of 0.05 mol/L to 5 mol/L. A small amount of an organic solvent having miscibility to water may be further added.

Examples of the organic solvent having miscibility to water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, s-caprolactone, γ-butyrolactone, dimethylformamide, dimethylacetamide, hexamethylphosphoramide, ethyl lactate, methyl lactate, s-caprolactame, and N-methylpyrrolidone. The concentration of the organic solvent is preferably 0.1 mass % to 30 mass %.

As the developer, commercially available products can be used, and examples thereof include CD1 (manufactured by Fujifilm Corporation).

Well-known surfactants can be added to the developer. The concentration of the surfactant is preferably 0.01 mass % to 10 mass %.

The method of the development may be any one of puddle development, shower development, shower and spin development, and dip development.

Here, if the shower development is described, the unhardened portion can be removed by spraying the developer to the photosensitive resin layer after exposure by a shower. Before the development, it is preferable to remove the thermoplastic resin layer and the interlayer by spraying an alkaline liquid having low solubility of the photosensitive resin layer by a shower or the like. After the development, it is preferable to remove development residues by spraying a washing agent and the like by a shower while performing rubbing with a brush.

The liquid temperature of the developer is preferably 20° C. to 40° C., and pH of the developer is preferably 8 to 13.

(Post Baking Step)

It is preferable to include a post baking step after the exposure and development step, and it is more preferable to include a step of performing post baking after the step of removing the thermoplastic resin layer and the interlayer.

The method for manufacturing the film transfer material is preferable to form the film transfer material by heating the white coloration layer and the light shielding layer of the film transfer material to 180° C. to 300° C. under the environment of 0.08 atm to 1.2 atm, in view of compatibility between whiteness and productivity.

The heating of the post baking is even more preferably performed under the environment of 0.5 atm or greater. Meanwhile, the heating of the post baking is more preferably performed under the environment of 1.1 atm or less and particularly preferably performed under the environment of 1.0 atm or less. The heating of the post baking is more particularly preferably performed under the environment of about 1 atm (atmospheric pressure) in view of reducing a manufacturing cost without using a particular depressurization device. Here, in the related art, in the case where the white coloration layer and the light shielding layer are hardened by heating and formed, the heating is performed under decompression environment of extremely low pressure and the oxygen concentration is lowered, so as to maintain the whiteness after baking. However, if the film transfer material is used, even after baking is performed in the range of the pressure, the tint of the white coloration layer and the light shielding layer of the substrate with the decorative material on the substrate side according to the invention is improved (b value is reduced), such that whiteness can be improved.

The temperature of the post baking is more preferably 70° C. to 280° C., and particularly preferably 90° C. to 260° C.

The time of the post baking is more preferably 20 minutes to 150 minutes and particularly preferably 30 minutes to 100 minutes.

The post baking may be performed under the air environment or under the nitrogen substitution environment, but it is particularly preferable to be performed under the air environment, in view of reducing a manufacturing cost without using a particular depressurization device.

[Touch Panel]

The touch panel according to the invention has a hardened product of a photosensitive laminate according to the invention.

<Touch Panel and Image Display Device Comprising Touch Panel as a Configuration Element>

The touch panel has a front surface plate (also referred to as a substrate) and at least elements of (1) to (4) below on a contactless side of the front surface plate and can include the photosensitive laminate according to the invention, as the laminate of the front surface plate (substrate) and (1) the decorative material including the light shielding layer (second resin layer) and the white coloration layer (first resin layer).

(1) A decorative material including a light shielding layer and a white coloration layer (2) Plural first transparent electrode patterns formed by extending plural pad portions via connecting portions in a first direction (3) Plural second electrode patterns that are electrically insulated from the first transparent electrode patterns and consist of plural pad portions formed by being extended in the direction intersecting to the first direction (4) An insulating layer that electrically insulates the first transparent electrode patterns and the second electrode patterns In the touch panel, the second electrode patterns may be transparent electrode patterns.

The touch panel may further have (5) below.

(5) A conductive element that is electrically connected to at least one of the first transparent electrode pattern or the second transparent electrode pattern and that is different from the first transparent electrode pattern and the second transparent electrode pattern <Configuration of Touch Panel>

First Embodiment

Figure 3:
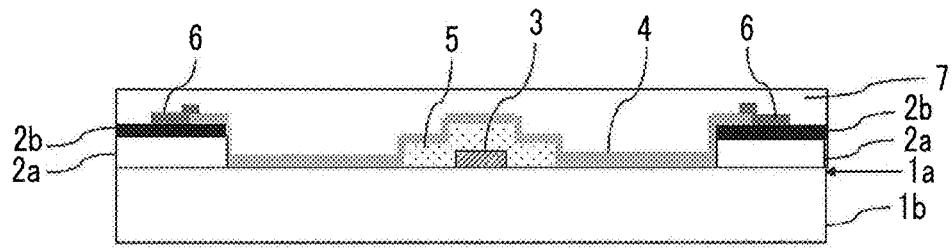
FIG. 3 is a sectional view schematically illustrating an example of a configuration of a touch panel of the invention.

First, a configuration of the touch panel according to the first embodiment that is formed by the manufacturing method according to the invention is described. FIGS. 3 and 4 are sectional views illustrating a preferable configuration in the touch panel according to the first embodiment of the invention. The touch panel in FIG. 3 includes a front surface plate 1b (cover glass), a white coloration layer (first resin layer) 2a, a light shielding layer (second resin layer) 2b, a first transparent electrode pattern 3, a second transparent electrode pattern 4, an insulating layer 5, a conductive element 6, and a transparent protective layer 7. The touch panel includes an interlayer (not illustrated) between the white coloration layer 2a and the light shielding layer 2b.

The front surface plate 1 and/or 1b is preferably formed with light transmissive substrates. As the light transmissive substrate, any one of a substrate provided with the decorative material on the cover glass 1b or a substrate provided with the decorative material below on a film substrate in an order of the cover glass 1b and a film substrate 1 can be used. In the case where the decorative material is provided on the cover glass, the decorative material is preferable for thinning the touch panel, and in the case where the decorative material is provided on the film substrate and can be bonded to the cover glass, the decorative material is preferable for the touch panel productivity.

The cover glass 1b can be further provided on the opposite side of the electrode of the film substrate. As the glass substrate, strengthened glass represented by Gorilla glass manufactured by Corning Incorporated and the like can be used. In FIGS. 3 and 4, a side on which respective elements of the front surface plate 1 and/or 1b are provided is referred to as a contactless surface 1a. In the touch panel according to the invention, an input is performed by causing a finger or the like to come into contact with the contact surface of the front surface plate 1 and/or 1b (a surface opposite to contactless surface 1a). Hereinafter, the front surface plate may be called a "substrate" in some cases.

The white coloration layer 2a and the light shielding layer 2b are provided on the contactless surfaces of the front surface plate 1 and/or 1b. The white coloration layer 2a and the light shielding layer 2b are frame-shaped patterns in vicinity of a light transmissive area (display area) formed on the contactless side of the touch panel front surface plate as the decorative material and are formed for the purpose of causing routing wiring and the like not to be seen or for the purpose of decoration.

Wiring lead-out ports (not illustrated) can be provided in the touch panel. In the case where the substrate with the decorative material of the touch panel having wiring lead-out portions is formed, if a decorative material consisting of the white coloration layer 2a and the light shielding layer 2b is intended to be formed by using a liquid resist for forming a decorative material or screen printing ink, there may be a problem in that a leakage of a resist component from a wiring lead-out portion or extrusion of a resist component from a glass end in the decorative material such that a back side of the substrate is contaminated. However, in the case where a substrate with a decorative material having wiring lead-out portions is used, this problem can be solved.

The plural first transparent electrode patterns 3 that are formed by extending plural pad portions via connecting portions in the first direction, the plural second transparent electrode patterns 4 that are electrically insulated from the first transparent electrode patterns 3 and consist of plural pad portions formed by being extended in the direction intersecting to the first direction, and the insulating layer 5 that electrically insulates the first transparent electrode patterns 3 and the second transparent electrode patterns 4 are formed on the contactless surface of the front surface plate 1 and/or 1b. For example, the first transparent electrode patterns 3, the second transparent electrode patterns 4, and the conductive elements 6 described below can be manufactured with light transmissive conductive metal oxide films such as indium tin oxide (ITO) or indium zinc oxide (IZO). Examples of this metal film include an ITO film; a metal film such as Al, Zn, Cu, Fe, Ni, Cr, and Mo; and a metal oxide film such as $SiO_2$. At this point, the film thickness of each element can be 10 nm to 200 nm. Since an amorphous ITO film is formed to be a polycrystalline ITO film by firing an electrical resistance may be reduced. The first transparent electrode patterns 3, the second transparent electrode patterns 4, and the conductive elements 6 described below can be manufactured by using a transfer film having a decorative material using conductive fibers. In the case where first conductive patterns and the like are formed with ITO or the like, paragraphs "0014" to "0016" of JP4506785B can be referred to.

At least one of the first transparent electrode patterns 3 or the second transparent electrode patterns 4 can be provided on both areas of the contactless surface of the front surface plate 1 and/or 1b and the surface on the opposite side of the light shielding layer 2b to the front surface plate 1 and/or 1b. FIGS. 3 and 4 illustrate diagrams in which the second transparent electrode patterns 4 are provided on both areas of the contactless surface of the front surface plate 1 and/or 1b and the surface on the opposite side of the light shielding layer 2b to the front surface plate 1 and/or 1b, and the side surface of the white coloration layer 2a is covered with the second transparent electrode patterns 4. However, the width of the white coloration layer 2a can be caused to be narrower than that of the light shielding layer 2b. In this case, at least one of the first transparent electrode patterns 3 or the second transparent electrode patterns 4 can be provided throughout the contactless surface of the front surface plate 1 and/or 1b, the surface on the opposite side of the white coloration layer 2a and the light shielding layer 2b to the front surface plate 1 and/or 1b. In this manner, even in the case where a transfer film is laminated throughout the decorative material including the white coloration layer 2a and the light shielding layer 2b which requires a predetermined thickness and the back surface of the front surface plate, if a film transfer material (particularly, a film transfer material having the thermoplastic resin layer) is used, even if expensive equipment such as a vacuum laminator is not used, laminating in which bubbles are not generated in the portion boundary of the decorative material 2 can be performed in a simple step.

Figure 6:
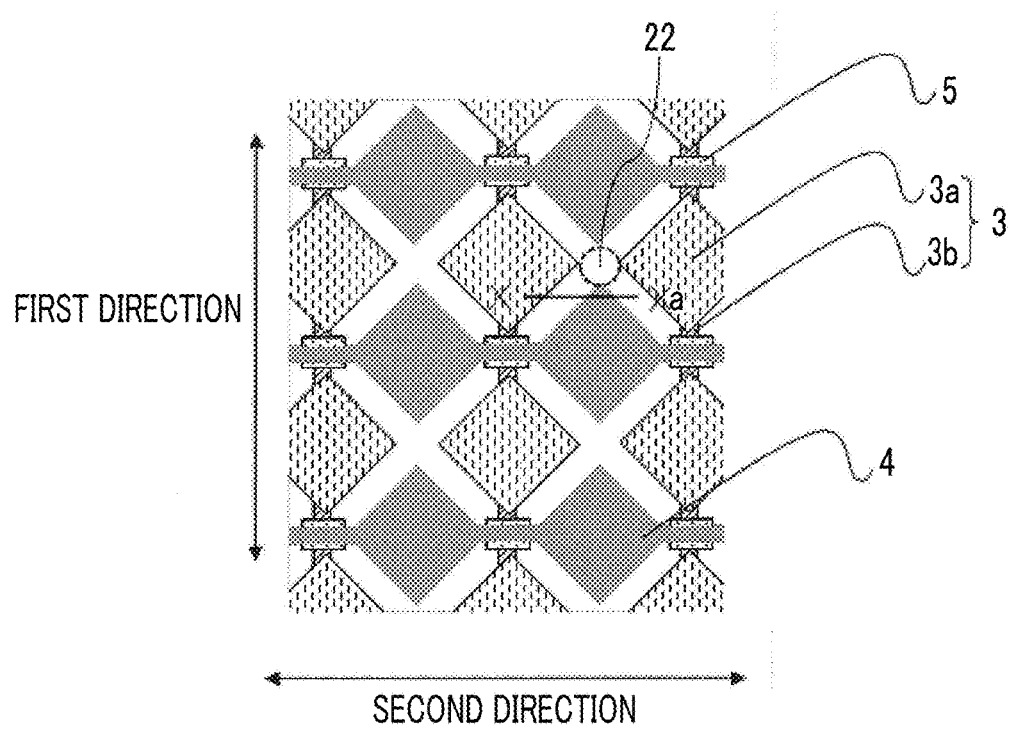
FIG. 6 is a diagram illustrating an example of a first transparent electrode pattern and a second transparent electrode pattern in a touch panel of the invention.

The first transparent electrode patterns 3 and the second transparent electrode patterns 4 are described with reference to FIG. 6. FIG. 6 is a diagram illustrating an example of the first transparent electrode pattern and the second transparent electrode pattern according to the invention. As illustrated in FIG. 6, the first transparent electrode patterns 3 are formed by extending pad portions 3a via connecting portions 3b in the first direction. The second transparent electrode patterns 4 are electrically insulated from the first transparent electrode patterns 3 by the insulating layer 5 and formed by plural pad portions formed by being extended in the direction (second direction in FIG. 6) intersecting to the first direction. Here, in the case where the first transparent electrode patterns 3 are formed, the pad portions 3a and the connecting portions 3b may be manufactured in an integrated manner, or only the connecting portions 3b are manufactured, and the pad portions 3a and the second transparent electrode patterns 4 are manufactured (patterning) in an integrated manner. In the case where the pad portions 3a and the second transparent electrode patterns 4 are manufactured (patterned) in an integrated manner, respective layers are formed such that a portion of the connecting portions 3b and a portion of the pad portions 3a are connected as illustrated in FIG. 6, and the first transparent electrode patterns 3 and the second transparent electrode patterns 4 are electrically insulated by the insulating layer 5.

In FIGS. 3 and 4, the conductive elements 6 are formed on the surface on the opposite side of the light shielding layer 2b to the front surface plate 1 and/or 1b. The conductive elements 6 are electrically connected to at least one of the first transparent electrode patterns 3 and the second transparent electrode patterns 4 and are elements different from the first transparent electrode patterns 3 and the second transparent electrode patterns 4. In FIGS. 3 and 4, diagrams in which the conductive elements 6 are connected to the second transparent electrode patterns 4 are illustrated.

In FIGS. 3 and 4, the transparent protective layer 7 is provided such that all configuration elements are covered. The transparent protective layer 7 may be formed such that only a portion of the configuration elements is covered. The insulating layer 5 and the transparent protective layer 7 may be formed with the same material or different materials. As materials forming the insulating layer 5 and the transparent protective layer 7, materials having high surface hardness and heat resistance are preferable, and well-known photosensitive siloxane resin materials, acryl resin materials, and the like are used.

Figure 7:
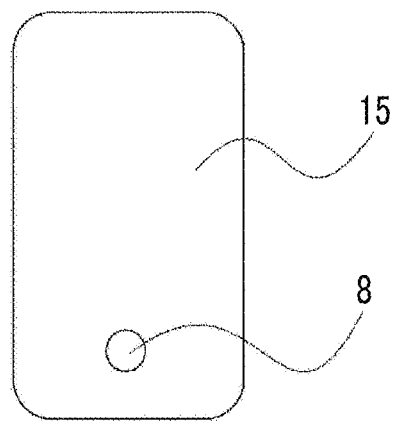
FIG. 7 is a plan view illustrating an example of strengthening treated glass in which an opening is formed.
Figure 8:
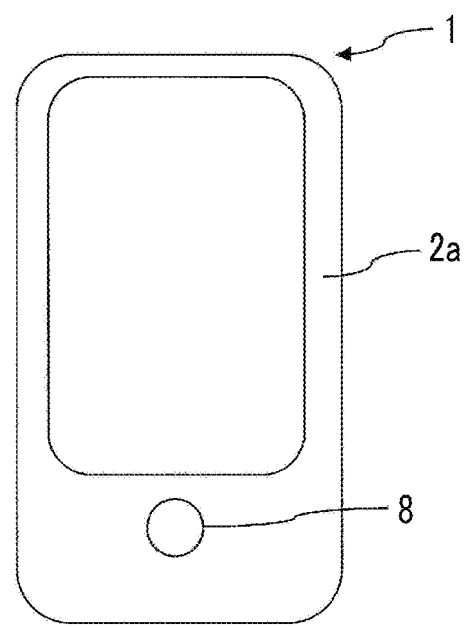
FIG. 8 is a plan view illustrating an example of a touch panel according to the invention in which a white coloration layer and a light shielding layer are formed.
Figure 9:
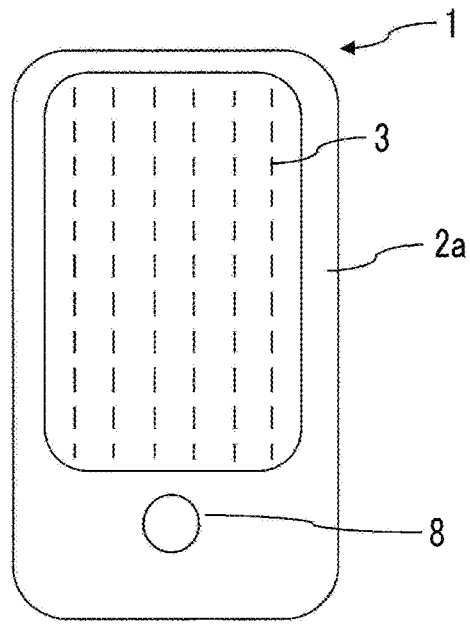
FIG. 9 is a plan view illustrating an example of a touch panel according to the invention in which a first transparent electrode pattern is formed.
Figure 10:
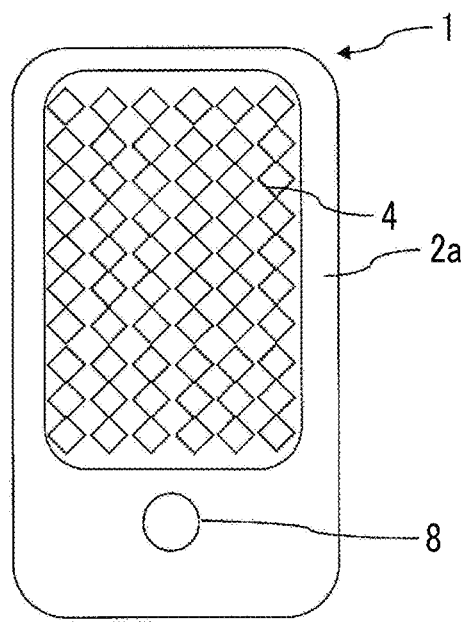
FIG. 10 is a plan view illustrating an example of a touch panel according to the invention in which first and second transparent electrode patterns are formed.
Figure 11:
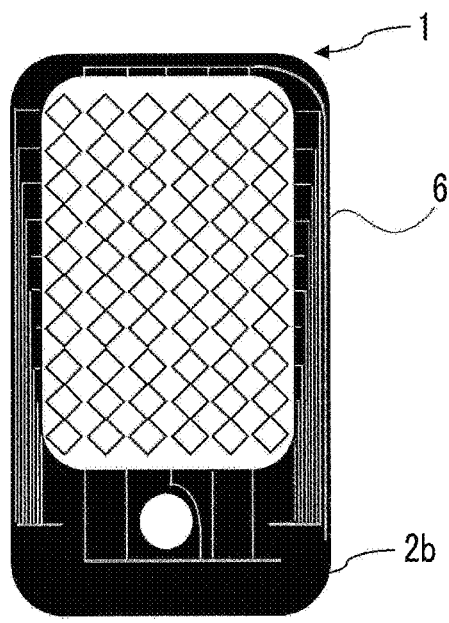
FIG. 11 is a plan view illustrating an example of a touch panel according to the invention in which a conductive element which is different from the first and second transparent electrode patterns is formed.

Embodiment examples that are formed in the process of the manufacturing method according to the invention include embodiments of FIGS. 7 to 11. FIG. 7 is a plan view illustrating an example of strengthening treated glass 15 in which the opening 8 is formed. FIG. 8 is a plan view illustrating an example of a front surface plate in which the decorative layer 2a is formed. FIG. 9 is a plan view illustrating an example of a front surface plate in which the first transparent electrode patterns 3 are formed. FIG. 10 is a plan view illustrating an example of a front surface plate in which the first transparent electrode patterns 3 and the second transparent electrode patterns 4 are formed. FIG. 11 is a plan view illustrating an example of a front surface plate in which the conductive elements 6 which are different from the first and second transparent electrode patterns are formed. These drawings illustrate examples in which the description is specified, and the scope of the invention is not limited to these drawings.

Configurations disclosed in "Latest Touch Panel Technology" (published on Jul. 6, 2009 from Techno Times Co.), "Development and Technology of Touch Panel" supervised by Yuji Mitani, published from CMC (December 2004), and FPD International 2009 Forum T-11 Lecture Text Book, Cypress Semiconductor Corporation Application Note AN2292 can be applied to the touch panel and the image display device comprising the touch panel as configuration elements.

Second Embodiment

The preferable configuration of the touch panel according to the second embodiment of the invention is described together with the method for manufacturing respective members forming the device. The descriptions of portions that are overlapped with those in the first embodiment are appropriately omitted.

Figure 12:
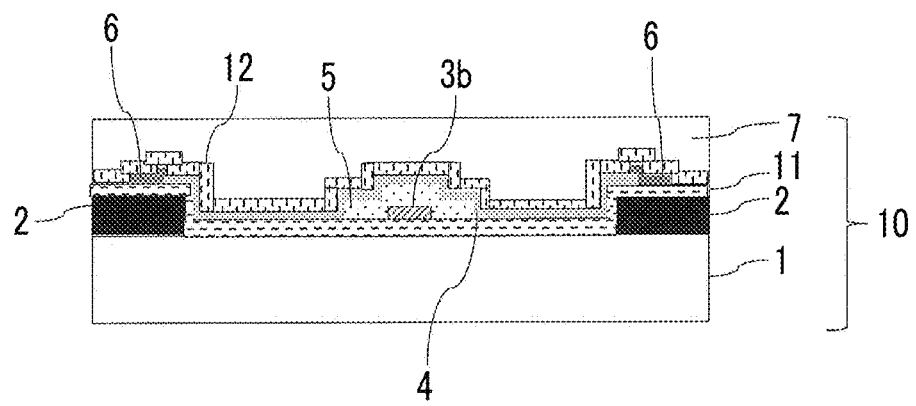
FIG. 12 is a sectional view schematically illustrating another example of a configuration of a touch panel of the invention.

FIG. 12 is a sectional view schematically illustrating a preferable configuration of the touch panel according to the second embodiment the invention. In FIG. 12, an embodiment in which a touch panel 10 according to the second embodiment is formed with the transparent substrate (front surface plate) 1, the decorative material 2, a transparent film 11 having a refractive index of 1.6 to 1.78 and a film thickness of 55 nm to 110 nm, the first transparent electrode patterns 3, the second transparent electrode patterns 4, the insulating layer 5, the conductive elements 6, a second curable transparent resin layer (refractive index adjusting layer) 12, and a first curable transparent resin layer 7 (protective layer) is illustrated.

Figure 13:
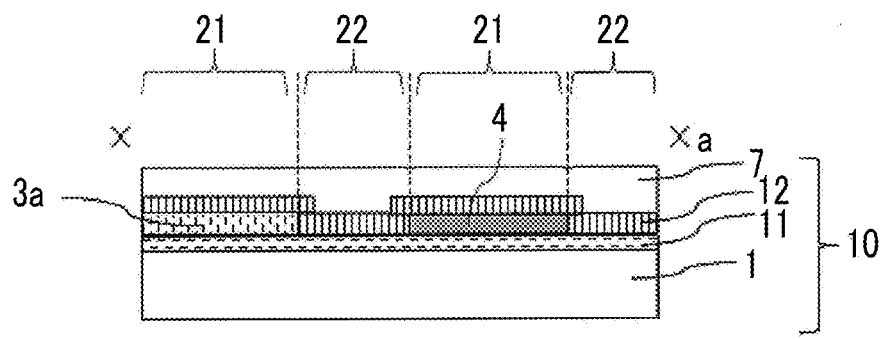
FIG. 13 is a sectional view schematically illustrating another example of a configuration of a touch panel of the invention.

FIG. 13 illustrating a cross section taken along line X-Xa in FIG. 6 is also a cross section illustrating a preferable configuration of the touch panel. In FIG. 13, an embodiment in which the touch panel 10 is formed with the transparent substrate (front surface plate) 1, the transparent film 11 having a refractive index of 1.6 to 1.78 and the film thickness of 55 nm to 110 nm, the first transparent electrode patterns 3, the second transparent electrode patterns 4, the second curable transparent resin layer 12, and the first curable transparent resin layer 7 is illustrated.

The decorative material 2 is provided on the contactless surface of the front surface plate 1, and has the same functions and configurations as the decorative material according to the first embodiment. Areas on which the first transparent electrode patterns 3, the second transparent electrode patterns 4, or the conductive elements 6 in FIG. 6 are not formed correspond to non-patterned areas 22 in the transparent laminate according to the invention, and the reference numeral 22 in FIG. 13 corresponds to an area in which the transparent electrode pattern, the second curable transparent resin layer, and the first curable transparent resin layer are laminated in this order.

In FIG. 12, the first curable transparent resin layer 7 is provided such that all configuration elements are covered. The first curable transparent resin layer 7 may be formed such that only a portion of the configuration elements is covered. The insulating layer 5 and the first curable transparent resin layer 7 may be the same material or may be different materials. As the material forming the insulating layer 5, the materials exemplified as the materials of the first or second curable transparent resin layers in the transparent laminate according to the invention can be preferably used.

[Information Display Device]

The information display device according to the invention has the touch panel according to the invention.

As the information display device that can use the touch panel according to the invention, a mobile device is preferable, and examples thereof include information display devices below:

iPhone 4, iPad (hereinafter, registered trademark, manufactured by Apple Inc., USA.), Xperia (SO-01B) (manufactured by Sony Mobile Communications Inc.), Galaxy S (SC-02B), Galaxy Tab (SC-01C) (above are manufactured by Samsung Electronics Co., Ltd., Korea), BlackBerry 8707h (manufactured by BlackBerry Limited, Canada), Kindle (manufactured by Amazon.com, Inc., USA), and Kobo Touch (manufactured by Rakuten, Inc.).

EXAMPLES

Hereinafter, characteristics of the invention are specifically described with reference to examples and comparative examples. The material, usage amounts, ratios, treatment contents, treatment orders, and the like described in the examples below can be appropriately changed without departing from the gist of the invention. However, the scope of the invention should not be interpreted in a limited manner by specific examples below.

Example 1

<Manufacturing of Transfer Material>
<<Forming of Second Resin Layer>>

As a temporary support, a surface of a release layer of a polyethylene terephthalate (PET) base (UNIPEEL TR6, manufactured by Unitika Ltd., and thickness of 50 μm) with a release layer was coated with a second resin layer coating liquid (K1) consisting of prescription below, and drying was performed at 120° C. for 2 minutes, so as to obtain a second resin layer (light shielding layer) having a dry film thickness of 3 μm.

(Coating Liquid for Second Resin Layer: Prescription K1)

| | |
|---|---|
| Carbon black dispersion liquid (Pigment ratio: 31.3%, composition below): | 360 parts by mass |
| Propylene glycol monomethyl ether acetate: | 115 parts by mass |
| Methyl ethyl ketone: | 400 parts by mass |
| Photopolymerization initiator (IRGACURE 907, manufactured by BASF Japan Ltd.): | 2.38 parts by mass |
| Acryl-based resin in structure represented in [Chem. 1] below: | 61.1 parts by mass |
| Monomer DPHA (propylene glycol monomethyl ether acetate solution solid content: 76 mass %) (manufactured by Nippon Kayaku Co., Ltd.): | 61.2 parts by mass |
| Fluorine-based compound (MEGAFACE F-556, manufactured by DIC Corporation): | 0.600 parts by mass |

The pigment dispersion liquid had the composition as below, a pigment and a dispersing agent which was dissolved in an organic solvent in advance were mixed, and a dispersion treatment was performed for one hour by a paint shaker (manufactured by Toyo Seiki Seisaku-Sho, Ltd.) for one hour.

| | |
|---|---|
| Carbon black (Product name: Nipex 35, Evonik Degussa GMBH): | 13.05 parts by mass |
| Methyl ethyl ketone: | 85.64 parts by mass |
| SOLSPERSE 32000 (manufactured by Avecia) | 1.31 parts by mass |

With respect to the dispersion due to the paint shaker, the dispersion was performed by adding zirconia beads having a diameter of 0.5 mm to a plastic bottle used in the paint shaker, in a ratio of dispersion liquid:zirconia beads=1:6 in terms of a weight ratio.

<<Forming of Interlayer>>

The second resin layer was coated with the interlayer coating liquid (I2) of the prescription below, and drying was performed at 120° C. for 2 minutes, so as to obtain an interlayer having a dry film thickness of 2 μm.

(Coating Liquid for Interlayer: Prescription I2)

| | |
|---|---|
| Pure water: | 524 parts by mass |
| Methanol: | 429 parts by mass |
| Polyvinyl alcohol (PVA205, manufactured by Kuraray co., Ltd.): | 21.1 parts by mass |
| Polyvinyl alcohol (K-30, manufactured by ISP Japan, Ltd.): | 9.75 parts by mass |

<<Forming of First Resin Layer>>

The interlayer was coated with the first resin layer coating liquid (W1) in the prescription below, and drying was performed at 120° C. for 4 minutes, so as to obtain a first resin layer (white material layer) having a dry film thickness of 20 μm.

According to operations above, photosensitive transfer materials were manufactured.

(Coating Liquid for First Resin Layer: Prescription W1)

| | |
|---|---|
| Titanium dioxide dispersion liquid (pigment ratio: 31.3%, Composition below): | 179 parts by mass |
| Methyl ethyl ketone: | 131 parts by mass |
| Fluorescent brightening agent (Tinopal OB, manufactured by BASF Japan Ltd.): | 4.00 parts by mass |
| Propylene glycol monomethyl ether acetate: | 216 parts by mass |
| Acryl-based resin in a structure shown below: | 302 parts by mass |
| Monomer DPHA (propylene glycol monomethyl ether acetate solution solid content: 76 mass %) (manufactured by Nippon Kayaku Co., Ltd.): | 161 parts by mass |
| Fluorine-based compound (MEGAFACE F-556, manufactured by DIC Corporation): | 1.60 parts by mass |

The pigment dispersion liquid had the composition as below, a pigment and a dispersing agent which was dissolved in an organic solvent in advance were mixed, and a dispersion treatment was performed for one hour by a paint shaker (manufactured by Toyo Seiki Seisaku-Sho, Ltd.) for one hour.

| | |
|---|---|
| Rutile titanium dioxide (Product name: JR-805, manufactured by Tayca Corp.): | 70.00 parts by mass |
| Methyl ethyl ketone: | 26.50 parts by mass |
| SOLSPERSE 32000 (manufactured by Avecia): | 3.50 parts by mass |

With respect to the dispersion due to the paint shaker, the dispersion was performed by adding zirconia beads having a diameter of 0.5 mm to a plastic bottle used in the paint shaker, in a ratio of dispersion liquid:zirconia beads=1:6 in terms of a weight ratio.

Acryl-based resin (disclosed in JP2008-146018A)

[Chem. 1]

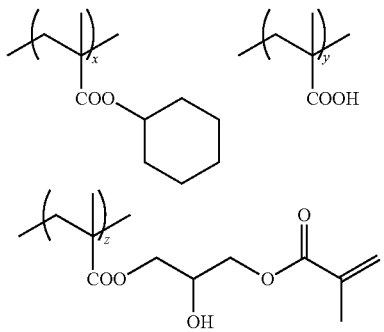

P-24 x:y:z = 44:16:40

A cover film (polyethylene film (Product name: GF-8) having a thickness of 30 μm manufactured by Tamapoly Co., Ltd.) was laminated on the second resin layer, at 25° C., under the condition of 1 MPa and 1.0 m/min.

According to operations above, the transfer material was manufactured.

<Manufacturing of Photosensitive Laminate>

The transfer material manufactured above was transferred to a glass support (EAGLE XG manufactured by Corning Incorporated, thickness of 0.7 mm) after a cover film was peeled, and a photosensitive laminate was manufactured.

Examples 2 and 3 and Comparative Example 1

<Manufactured of Transfer Material>

The transfer material was manufactured in the same manner as in Example 1, except for changing coating liquids of the first resin layer, the interlayer, and the second resin layer as in Table 1.

Prescription of respective coating liquids used in Examples 2 and 3 and Comparative Example 1 are described below.

(Coating Liquid for Second Resin Layer: Prescription K2)

| | |
|---|---|
| Carbon black dispersion liquid (pigment ratio: 31.3%): | 360 parts by mass |
| Propylene glycol monomethyl ether acetate: | 115 parts by mass |
| Methyl ethyl ketone: | 400 parts by mass |
| Photopolymerization initiator (IRGACURE 907, manufactured by BASF Japan Ltd.): | 0.81 parts by mass |
| Acryl-based resin in a structure represented by [Chem. 1] above: | 61.1 parts by mass |
| Monomer DPHA (propylene glycol monomethyl ether acetate solution solid content: 76 mass %) (manufactured by Nippon Kayaku Co., Ltd.): | 61.2 parts by mass |
| Fluorine-based compound (MEGAFACE F-556, manufactured by DIC Corporation): | 0.600 parts by mass |

(Coating Liquid for Interlayer: Prescription I1)

| | |
|---|---|
| Pure water: | 524 parts by mass |
| Methanol: | 429 parts by mass |
| Polyvinyl alcohol (PVA205, manufactured by Kuraray co., Ltd.): | 21.1 parts by mass |
| Polyvinyl alcohol (K-30, manufactured by ISP Japan, Ltd.): | 9.75 parts by mass |
| Monomer LIGHT ACRYLATE (3EG-A, manufactured by Kyoeisha Chemical Co., Ltd.): | 15.4 parts by mass |
| Photopolymerization initiator (IRGACURE 2959, manufactured by BASF Japan Ltd.): | 0.772 parts by mass |

(Coating Liquid for First Resin Layer: Prescription W2)

| | |
|---|---|
| Titanium dioxide dispersion liquid (pigment ratio: 31.3%): | 179 parts by mass |
| Methyl ethyl ketone: | 131 parts by mass |
| Photopolymerization initiator (IRGACURE 907, manufactured by BASF Japan Ltd.): | 3.13 parts by mass |
| Fluorescent brightening agent (Tinopal OB, manufactured by BASF Japan Ltd.): | 4.00 parts by mass |
| Propylene glycol monomethyl ether acetate: | 216 parts by mass |
| Acryl-based resin in the structure above: | 302 parts by mass |
| Monomer DPHA (propylene glycol monomethyl ether acetate solution solid content: 76 mass %) (manufactured by Nippon Kayaku Co., Ltd.): | 161 parts by mass |
| Fluorine-based compound (MEGAFACE F-556, manufactured by DIC Corporation): | 1.60 parts by mass |

<Manufacturing of Photosensitive Laminate>

The transfer material manufactured above was transferred onto a glass support (EAGLE XG manufactured by Corning Incorporated, thickness of 0.7 mm) after a cover film was peeled, and a photosensitive laminate was manufactured.

Example 4

<Manufacturing of Photosensitive Laminate>

TAC (FUJITAC, manufactured by Fujifilm Corporation, thickness: 60 μm) which was a support was coated with the coating liquid for the first resin layer of the prescription above (W1), and drying was performed at 120° C. for 2 minutes, so as to obtain a first resin layer having a dry film thickness of 20 μm.

The first resin layer was coated with the coating liquid for the interlayer of the prescription above (I2), and drying was performed at 120° C. for 2 minutes, so as to obtain an interlayer having a dry film thickness of 2 μm.

The interlayer was coated with the coating liquid for the second resin layer (K1), and drying was performed at 120° C. for 4 minutes, so as to obtain a second resin layer (light shielding layer) having a dry film thickness of 3 μm.

A cover film (manufactured by Oji F-Tex Co., Ltd., polypropylene film having the thickness of 12 μm (Product name: ALPHAN)) was laminated on the second resin layer at 25° C., under the condition of 1 MPa and 1.0 m/min.

According to operations above, the photosensitive laminate was manufactured.

<Evaluation of Exposure Sensitivity>

The glass support was coated respectively with the coating liquid for the first resin layer and the coating liquid for the second resin layer, the coating films were respectively hardened by exposure of several mJ or greater, and whether the coating films remained even after the development was evaluated.

As a result, since the coating liquid for the first resin layer W2 was (600) mJ/cm$^2$ and the coating liquid for the first resin layer W2 was non-photosensitive, it was considered that the coating liquid for the first resin layer W2 had lower sensitivity than all resin layers having photosensitivity. Since the coating liquid for the second resin layer K1 was (80) mJ/cm$^2$, the coating liquid for the second resin layer K2 was (700) mJ/cm$^2$, and the coating liquid for the second resin layer K3 was non-photosensitive, it was considered that the coating liquid for the second resin layer K3 had lower sensitivity than all resin layers having photosensitivity.

Examples 5 and 6

<Manufacturing of Photosensitive Laminate>

The photosensitive laminate was manufactured in the same manner as in Example 4, except for changing coating liquids of the first resin layer, the interlayer, and the second resin layer as in Table 1.

Prescription of respective coating liquids used in Examples 5 and 6 was as above.

Comparative Example 2

The first resin layer, the interlayer, and the second resin layer were respectively printed by using a screen printer (HP-320-type screen printer, manufactured by Newlong Seimitsu Kogyo Co., Ltd.) so as to manufacture the laminate.

The coating liquid used was as shown in Table 1. The prescription of the respective coating liquids was as above.

(Coating Liquid for Second Resin Layer: Prescription K3)

| | |
|---|---|
| Carbon black dispersion liquid (Pigment ratio: 31.3%): | 360 parts by mass |
| Propylene glycol monomethyl ether acetate: | 115 parts by mass |
| Methyl ethyl ketone: | 400 parts by mass |
| Acryl-based resin in a structure represented by [Chem. 1] above: | 61.1 parts by mass |
| Monomer DPHA (propylene glycol monomethyl ether acetate solution solid content: 76 mass %) (manufactured by Nippon Kayaku Co., Ltd.): | 61.2 parts by mass |
| Fluorine-based compound (MEGAFACE F-556, manufactured by DIC Corporation): | 0.600 parts by mass |

The content ratios of inorganic particles in the first resin layers and the second resin layers in Examples 1 to 6 and Comparative Examples 1 and 2 manufactured above were all 20 mass % or greater.

[Evaluation]
<Patterning Properties>

Patterns were manufactured by using photolithography under the conditions described below.

UV exposure was performed in a pattern shape via a photomask having a predetermined pattern in an exposure amount of 1,500 mJ/cm$^2$ (i rays).

In Examples 1 to 3 and Comparative Example 1, exposure was performed from the temporary support side before the temporary support was peeled.

In Examples 4 to 6, exposure was performed from the cover film side before the cover film was peeled.

After exposure, development was performed at 32° C. for 90 seconds by using a developer (used by diluting a raw liquid of a developer CD1 (manufactured by Fujifilm Corporation)) with pure water by 7 times), patterning was performed by removing the unhardened portion, and evaluation was performed in criteria below.

Figure 14:
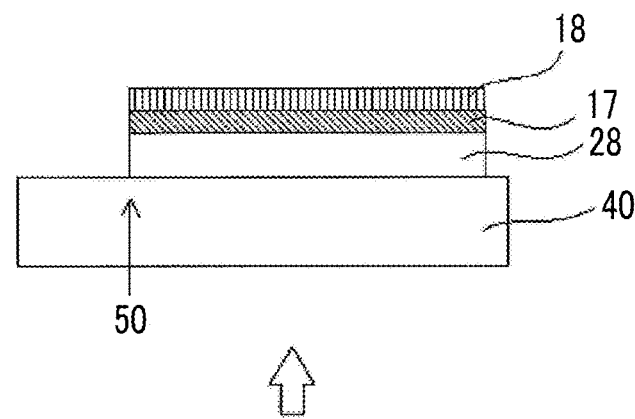
FIG. 14 is a sectional view schematically illustrating a photosensitive laminate according to an embodiment in which a pattern edge of a first resin layer and a pattern edge of a second resin layer are at the same position, in an evaluation of the patterning in an example. In the drawing, an outlined arrow represents an observed side.

A: Pattern edges of the first resin layer and pattern edges of the second resin layer were obtained at substantially the same positions, in the case where the first resin layer was a white material and the second resin layer was a backing layer for increasing covering power as in the decorative material in this test, high covering power was able to be obtained to the pattern edge as close as possible, and thus preferable appearance was able to be obtained. (see the state illustrated in FIG. 14)

Figure 15:
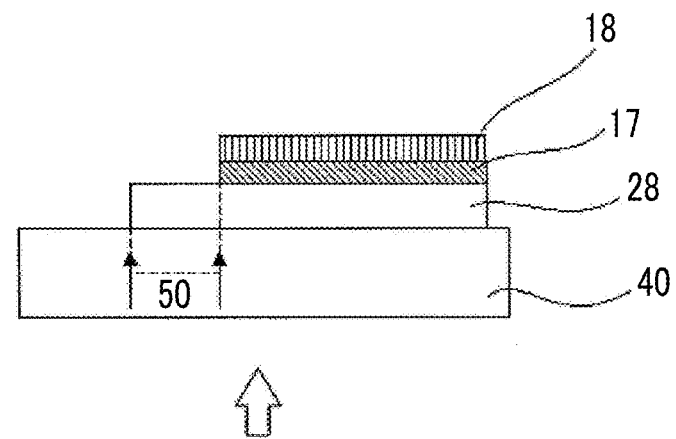
FIG. 15 is a sectional view schematically illustrating a photosensitive laminate according to an embodiment in which a pattern edge of the first resin layer and a pattern edge of the second resin layer are separated in an evaluation of the patterning in an example. In the drawing, an outlined arrow represents an observed side.
Figure 16:
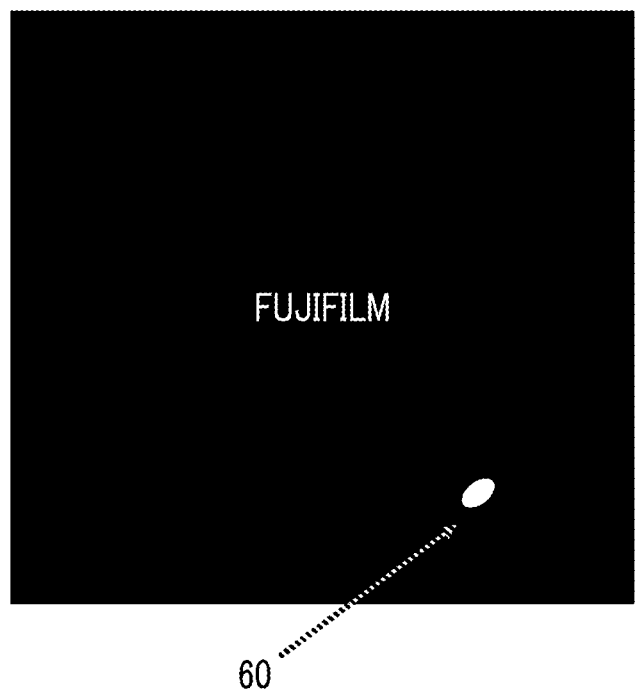
FIG. 16 is a plan view schematically illustrating an appearance of the peeling of the second resin layer when a patterned photosensitive laminate is seen on a second resin layer side in a peeling evaluation of a second resin layer in an example. FUJIFILM is a registered trademark.

B: Pattern edges of the second resin layer were separated from pattern edges of the first resin layer by several hundreds μm or greater, covering power in vicinity of the pattern decreased, and thus the separation was not preferable. (see the state illustrated in FIG. 15)

<Peeling of Light Shielding Layer (Second Resin Layer)>

A solid portion in which patterning was not performed by using a sample of which patterning properties were evaluated was observed. If there is a portion in which the second resin layer was peeled in the solid portion, in the case where the second resin layer was a backing layer, covering power of the portion decreased, and thus the peeling in the solid portion was not aesthetically preferable.

A: Peeling of the second resin layer (backing layer) was small, and thus it was most preferable. The peeled portion was less than 0.1% with respect to the entire portions, in terms of an area ratio.

B: Though peeling of the second resin layer was greater than A, but the peeling was small. The peeled portion was 0.1% or greater and less than 1% with respect to the entire portions, in terms of an area ratio.

C: Peeling of the second resin layer was greater than B. The peeled portion was 1% or greater and less than 10% with respect to the entire portions, in terms of an area ratio.

D: Peeling of the second resin layer was greater than C, and it was not preferable. The peeled portion was 10% or greater with respect to the entire portions, in terms of an area ratio.

<Need for Alignment>

In the case where the first resin layer was a white material, and the second resin layer was a black backing layer, if positions of the first resin layer and the second resin layer were deviated, extrusion of the backing layer was seen from an edge portion of the pattern, or covering properties of the pattern edge portion of the white material became insufficient. Therefore, the deviation was not aesthetically preferable.

A: Since it was possible to obtain a pattern by the exposure and the development at one time, alignment, exposure, and development for the first resin layer and the second resin layer were not required to be performed, respectively.

B: After the first resin layer was printed in a pattern shape, printing was required to be performed while the second resin layer was aligned to a position of the pattern.

TABLE 1

| | | Comparative Example 1 | Example 1 | Example 2 | Example 3 | Example 4 | Example 5 | Example 6 | Comparative Example 2 |
|---|---|---|---|---|---|---|---|---|---|
| Material configuration | Support | Glass (Transfer) | Glass (Transfer) | Glass (Transfer) | Glass (Transfer) | TAC (Coating) | TAC (Coating) | TAC (Coating) | Glass (Coating) |
| | Temporary support | TR-6 | TR-6 | TR-6 | TR-6 | None | None | None | None |
| | First resin | W2 | W1 | W1 | W2 | W1 | W1 | W2 | W2 |

TABLE 1-continued

|  |  | Comparative Example 1 | Example 1 | Example 2 | Example 3 | Example 4 | Example 5 | Example 6 | Comparative Example 2 |
|---|---|---|---|---|---|---|---|---|---|
|  | layer | | | | | | | | |
|  | Interlayer | I1 | I2 | I1 | I1 | I2 | I1 | I1 | I2 |
|  | Second resin layer | K2 | K1 | K1 | K1 | K1 | K1 | K1 | K3 |
| Exposure sensitivity | | First resin layer > Second resin layer | First resin layer < Second resin layer | First resin layer < Second resin layer | First resin layer < Second resin layer | First resin layer < Second resin layer | First resin layer < Second resin layer | First resin layer < Second resin layer | |
| Evaluation result | Patterning properties | B | A | A | A | A | A | A | A |
|  | Peeling of second resin layer | D | C | B | A | C | B | A | A |
|  | Need for alignment | A | A | A | A | A | A | A | B |

From the table above, in Examples 1 to 6, even if patterning of two or more layers was collectively performed, it is understood that evaluation of patterning properties, peeling of the second resin layer, and need for alignment was all excellent.

Example 101

<Manufacturing of Transfer Material>
<<Forming of Second Resin Layer>>

As the temporary support, the surface of a release layer of a polyethylene terephthalate (PET) base (UNIPEEL TR6, manufactured by Unitika Ltd., thickness of 50 μm) with the release layer was coated with a second resin layer coating liquid (OC1) consisting of prescription below, and drying was performed at 120° C. for 2 minutes, so as to obtain a second resin layer (overcoat layer) having a dry film thickness of 5 μm.
(Coating Liquid for Second Resin Layer: Prescription OC1)

| | |
|---|---|
| Propylene glycol monomethyl ether acetate: | 733 parts by mass |
| Methyl ethyl ketone: | 424 parts by mass |
| Monomer DPHA (propylene glycol monomethyl ether acetate solution solid content: 76 mass %) (manufactured by Nippon Kayaku Co., Ltd.): | 54.5 parts by mass |
| Monomer NK OLIGO UA-32P (manufactured by Shin-Nakamura Chemical Co., Ltd.): | 25.9 parts by mass |
| Monomer VISCOAT V#802 (manufactured by Osaka Organic Chemical Industry Ltd.): | 68.5 parts by mass |
| Acryl-based resin in the structure above: | 479 parts by mass |
| Photopolymerization initiator (IRGACURE 379EG, manufactured by BASF Japan Ltd.): | 6.36 parts by mass |
| Photopolymerization initiator (DETX-S, manufactured by Nippon Kayaku Co., Ltd.): | 6.36 parts by mass |
| Fluorine-based compound (MEGAFACE F-556, manufactured by DIC Corporation): | 1.93 parts by mass |

<<Forming of Interlayer>>

The second resin layer was coated with an interlayer coating liquid (I2) of the prescription above, and drying was performed at 120° C. for 2 minutes, so as to obtain an interlayer having a dry film thickness of 5 μm.

<<Forming of First Resin Layer>>

The interlayer was coated with a first resin layer coating liquid (IM1) of prescription below, and drying was performed at 120° C. for 4 minutes, so as to obtain a first resin layer (refractive index adjusting layer) having a dry film thickness of 80 μm.
(Coating Liquid for First Resin Layer: Prescription IM1)

| | |
|---|---|
| Zirconium oxide dispersion liquid Zr-010 (manufactured by Solar Co., Ltd., pigment ratio: 57.1%): | 63.7 parts by mass |
| Propylene glycol monomethyl ether acetate: | 584 parts by mass |
| Methyl ethyl ketone: | 811 parts by mass |
| Monomer DPHA (propylene glycol monomethyl ether acetate solution solid content: 76 mass %) (manufactured by Nippon Kayaku Co., Ltd.): | 1.96 parts by mass |
| Monomer NK OLIGO UA-32P (manufactured by Shin-Nakamura Chemical Co., Ltd.): | 0.93 parts by mass |
| Monomer VISCOAT V#802 (manufactured by Osaka Organic Chemical Industry Ltd.): | 2.47 parts by mass |
| Acryl-based resin in the structure above: | 13.0 parts by mass |
| Fluorine-based compound (MEGAFACE F-556, manufactured by DIC Corporation): | 0.18 parts by mass |

A cover film (polyethylene film (Product name: GF-8) having a thickness of 30 μm manufactured by Tamapoly Co., Ltd.) was laminated on the second resin layer, at 25° C., under the condition of 1 MPa and 1.0 m/min.

According to operations above, the transfer material was manufactured.

<Manufacturing of Photosensitive Laminate>

The transfer material manufactured above was transferred onto a PET film with ITO patterns after a cover film was peeled, and a photosensitive laminate was manufactured.

Examples 102 and 103 and Comparative Example 101

<Manufactured of Transfer Material>

A transfer material was manufactured in the same manner as in Example 101 except for changing the coating liquids of the first resin layer, the interlayer, and the second resin layer as shown in Table 2.

Prescription of each coating liquid used in Examples 102 and 103, and Comparative Example 101 is described below.
(Coating Liquid for Second Resin Layer: Prescription OC2)

| | |
|---|---|
| Propylene glycol monomethyl ether acetate: | 733 parts by mass |
| Methyl ethyl ketone: | 424 parts by mass |
| Monomer DPHA (propylene glycol monomethyl ether acetate solution solid content: 76 mass %) (manufactured by Nippon Kayaku Co., Ltd.): | 54.5 parts by mass |
| Monomer NK OLIGO UA-32P (manufactured by Shin-Nakamura Chemical Co., Ltd.): | 25.9 parts by mass |
| Monomer VISCOAT V#802 (manufactured by Osaka Organic Chemical Industry Ltd.): | 68.5 parts by mass |
| Acryl-based resin in the structure above: | 479 parts by mass |

-continued

| | |
|---|---|
| Photopolymerization initiator (IRGACURE 379EG, manufactured by BASF Japan Ltd.): | 2.17 parts by mass |
| Photopolymerization initiator (DETX-S, manufactured by Nippon Kayaku Co., Ltd.): | 2.17 parts by mass |
| Fluorine-based compound (MEGAFACE F-556, manufactured by DIC Corporation): | 1.93 parts by mass |

(Coating Liquid for Second Resin Layer: Prescription OC3)

| | |
|---|---|
| Propylene glycol monomethyl ether acetate: | 733 parts by mass |
| Methyl ethyl ketone: | 424 parts by mass |
| Monomer DPHA (propylene glycol monomethyl ether acetate solution solid content: 76 mass %) (manufactured by Nippon Kayaku Co., Ltd.): | 54.5 parts by mass |
| Monomer NK OLIGO UA-32P (manufactured by Shin-Nakamura Chemical Co., Ltd.): | 25.9 parts by mass |
| Monomer VISCOAT V#802 (manufactured by Osaka Organic Chemical Industry Ltd.): | 68.5 parts by mass |
| Acryl-based resin in the structure above: | 479 parts by mass |
| Fluorine-based compound (MEGAFACE F-556, manufactured by DIC Corporation): | 1.93 parts by mass |

(Coating Liquid for First Resin Layer: Prescription IM2)

| Zirconium oxide dispersion liquid | |
|---|---|
| Zr-010 (manufactured by Solar Co., Ltd., pigment ratio: 57.1%): | 63.7 parts by mass |
| Propylene glycol monomethyl ether acetate: | 584 parts by mass |
| Methyl ethyl ketone: | 811 parts by mass |
| Monomer DPHA (propylene glycol monomethyl ether acetate solution solid content: 76 mass %) (manufactured by Nippon Kayaku Co., Ltd.): | 1.96 parts by mass |
| Monomer NK OLIGO UA-32P (manufactured by Shin-Nakamura Chemical Co., Ltd.): | 0.93 parts by mass |
| Monomer VISCOAT V#802 (manufactured by Osaka Organic Chemical Industry Ltd.): | 2.47 parts by mass |
| Acryl-based resin in the structure above: | 13.0 parts by mass |
| Photopolymerization initiator (IRGACURE 379EG, manufactured by BASF Japan Ltd.): | 0.23 parts by mass |
| Photopolymerization initiator (DETX-S, manufactured by Nippon Kayaku Co., Ltd.): | 0.23 parts by mass |
| Fluorine-based compound (MEGAFACE F-556, manufactured by DIC Corporation): | 0.18 parts by mass |

<Manufacturing of Photosensitive Laminate>

The transfer material manufactured above was transferred onto a PET film with ITO patterns after a cover film was peeled, and a photosensitive laminate was manufactured.

<Evaluation of Exposure Sensitivity>

The glass support was coated respectively with the coating liquid for the first resin layer and the coating liquid for the second resin layer, the coating films were respectively hardened by exposure of several mJ or greater, and whether the coating films remained even after the development was evaluated.

As a result, since the coating liquid for the first resin layer IM2 was (70) mJ/cm² and the coating liquid for the first resin layer IM1 was non-photosensitive, it was considered that the coating liquid for the first resin layer IM1 had lower sensitivity than all resin layers having photosensitivity. Since the coating liquid for the second resin layer OC1 was 20 mJ/cm², the coating liquid for the second resin layer OC2 was 100 mJ/cm², and the coating liquid for the second resin layer OC3 was non-photosensitive, it was considered that the coating liquid for the second resin layer OC3 had lower sensitivity than all resin layers having photosensitivity.

Example 104

<Manufacturing of Photosensitive Laminate>

The PET film with ITO patterns which was a support was coated with a first resin layer coating liquid (IM1) of prescription above, and drying was performed at 120° C. for 2 minutes, so as to obtain a first resin layer (refractive index adjusting layer) having a dry film thickness of 80 nm.

The first resin layer was coated with a coating liquid for the interlayer (I2) of prescription above, and drying was performed at 120° C. for 2 minutes, so as to obtain an interlayer having a dry film thickness of 0.5 μm.

The interlayer was coated with a coating liquid for the second resin layer (OC1) of prescription above, and drying was performed at 120° C. for 4 minutes, so as to obtain a second resin layer (overcoat layer) having a dry film thickness of 5 μm.

A cover film (manufactured by Oji F-Tex Co., Ltd., polypropylene film having the thickness of 12 μm (Product name: ALPHAN)) was laminated on the second resin layer at 25° C., under the condition of 1 MPa and 1.0 m/min.

According to operations above, the photosensitive laminate was manufactured.

Examples 105 and 106

<Manufacturing of Photosensitive Laminate>

A photosensitive laminate was manufactured in the same manner as in Example 104 except for changing the coating liquids of the first resin layer, the interlayer, and the second resin layer as shown in the table below.

The prescription of the respective coating liquids used in Examples 105 and 106 was as above.

Comparative Example 102

The first resin layer, the interlayer, and the second resin layer were respectively printed by using a screen printer (HP-320-type screen printer, manufactured by Newlong Seimitsu Kogyo Co., Ltd.) so as to manufacture the laminate.

The content ratios of inorganic particles in the first resin layers in Examples 101 to 106 and Comparative Examples 101 and 102 manufactured above were all 20 mass % or greater.

[Evaluation]
<Patterning Properties>

Patterns were manufactured by using photolithography under the conditions described below.

UV exposure was performed in a pattern shape via a photomask having a predetermined pattern in an exposure amount of 100 mJ/cm² (i rays).

In Examples 101 to 103 and Comparative Example 101, exposure was performed from the temporary support side before the temporary support was peeled.

In Examples 104 to 106, exposure was performed from the cover film side before the cover film was peeled.

After exposure, development was performed at 30° C. for 60 seconds by using a developer (used by diluting a raw liquid of a developer CD1 (manufactured by Fujifilm Corporation) with pure water by 7 times), patterning was performed by removing the unhardened portion, and evaluation was performed in criteria below.

A: Pattern edges of the first resin layer and pattern edges of the second resin layer were obtained at substantially the same positions, in the case where the first resin layer was an IM layer (refractive index adjusting layer) and the second resin layer was an OC layer (protective layer) as in the decorative material in this test, the refractive index adjusting layer was covered with the protective layer to the pattern edge as close as possible, and thus it is preferable in view of protection functions.

B: Pattern edges of the second resin layer were separated from pattern edges of the first resin layer by several hundreds μm or greater, a portion which was not protected by the protective layer is generated in the refractive index adjusting layer in vicinity of the patterns, and thus it is not preferable.

A solid portion in which patterning was not performed by using a sample of which patterning properties were evaluated was observed. If there is a portion in which the second resin layer was peeled in the solid portion, in the case where the second resin layer was a protective layer, the portion was not protected, and thus the unprotected portion was not preferable, in view of protection functions.

A: (Peeling of the second resin layer (protective layer) was small, and thus it was most preferable) The peeled portion was less than 0.1% with respect to the entire portions, in terms of an area ratio.

B: (Though peeling of the second resin layer was greater than A, but the peeling was small) The peeled portion was 0.1% or greater and less than 1% with respect to the entire portions, in terms of an area ratio.

C: (Peeling of the second resin layer was greater than B) The peeled portion was 1% or greater and less than 10% with respect to the entire portions, in terms of an area ratio.

D: (Peeling of the second resin layer was greater than C, and it was not preferable) The peeled portion was 10% or greater with respect to the entire portions, in terms of an area ratio.

<Need for Alignment>

A test was performed in the same manner as in Example 1, and evaluation was performed in the same criteria.

EXPLANATION OF REFERENCES

1: substrate (film substrate. Only the film substrate may be referred to as a front surface plate)
1a: contactless surface
1b: glass (cover glass. Only the cover glass may be referred to as the front surface plate, and a laminate of a substrate and glass may be referred to as a front surface plate)
2: decorative material
2a: white coloration layer (white material layer)
2b: light shielding layer
3: conductive layer (first transparent electrode pattern)
3a: pad portion
3b: connecting portion
4: conductive layer (second electrode pattern)
5: insulating layer
6: conductive layer (another conductive element)
7: transparent protective layer (first curable transparent resin layer)
8: opening
10: electrostatic capacitance-type input device
11: transparent film
12: second curable transparent resin layer
15: strengthening treated glass
17: interlayer
18: second resin layer
21: area in which a transparent electrode pattern, a second curable transparent resin layer, and a first curable transparent resin layer are laminated in this order
22: non-patterned area
26: temporary support
28: first resin layer
29: cover film
30: transfer material
40: support

TABLE 2

| | | Comparative Example 101 | Example 101 | Example 102 | Example 103 | Example 104 | Example 105 | Example 106 | Comparative Example 102 |
|---|---|---|---|---|---|---|---|---|---|
| Material configuration | Support | PET with ITO patterning (transfer) | PET with ITO patterning (transfer) | PET with ITO patterning (transfer) | PET with ITO patterning (transfer) | PET with ITO patterning (coating) | PET with ITO patterning (coating) | PET with ITO patterning (coating) | PET with ITO patterning (coating) |
| | Temporary support | TR-6 | TR-6 | TR-6 | TR-6 | None | None | None | None |
| | First resin layer | IM2 | IM1 | IM1 | IM2 | IM1 | IM1 | IM2 | IM2 |
| | Interlayer | I1 | I2 | I1 | I1 | I2 | I1 | I1 | I2 |
| | Second resin layer | OC2 | OC1 | OC1 | OC1 | OC1 | OC1 | OC1 | OC3 |
| Exposure sensitivity | | First resin layer > Second resin layer | First resin layer < Second resin layer | First resin layer < Second resin layer | First resin layer < Second resin layer | First resin layer < Second resin layer | First resin layer < Second resin layer | First resin layer < Second resin layer | |
| Evaluation result | Patterning properties | B | A | A | A | A | A | A | A |
| | Peeling of second resin layer | D | C | B | A | C | B | A | A |
| | Need for alignment | A | A | A | A | A | A | A | B |

From the table above, in Examples 101 to 106, it is understood that even if patterning of two or more layers was collectively performed, evaluation of patterning properties, peeling of the second resin layer, and need for alignment was all excellent.

50: difference between a pattern edge of a first resin layer and a pattern edge of a second resin layer
60: peeling of second resin layer

What is claimed is:
1. A photosensitive laminate, comprising:
a support; and a first resin layer, an interlayer, and a second resin layer which are laminated on the support in this order, wherein at least one of the first resin layer or the second resin layer includes 20 mass % or greater of inorganic particles, exposure sensitivity of the second resin layer is higher than that of the first resin layer, the second resin layer contains a photopolymerization initiator and a polymerizable compound, the first resin layer, the interlayer, and the second resin layer are soluble in an aqueous alkali developer solution, the refractive index of the first resin layer is 1.60 to 1.78, and the film thickness of the first resin layer is 55 nm to 100 nm.

2. The photosensitive laminate according to claim 1, wherein the interlayer contains a photopolymerization initiator and a polymerizable compound.

3. The photosensitive laminate according to claim 1, wherein the first resin layer contains a photopolymerization initiator and a polymerizable compound.

4. The photosensitive laminate according to claim 1, wherein the first resin layer and the second resin layer are decorative layers, refractive index adjusting layers, or protective layers.

5. The photosensitive laminate according to claim 1, wherein the inorganic particles are made of rutile titanium dioxide, carbon black, or zirconium oxide.

6. The photosensitive laminate according to claim 1, wherein the interlayer is manufactured by using an aqueous coating liquid, an alcohol coating liquid, or a mixed coating liquid of water and alcohol.

7. The photosensitive laminate according to claim 1, wherein the interlayer contains polyvinyl alcohol.

8. A photosensitive laminate comprising:

a support; and a first resin layer, an interlayer, and a second resin layer which are laminated on the support in this order, wherein at least one of the first resin layer or the second resin layer includes 20 mass % or greater of inorganic particles, exposure sensitivity of the second resin layer is higher than that of the first resin layer, the second resin layer contains a photopolymerization initiator and a polymerizable compound, the first resin layer, the interlayer, and the second resin layer are soluble in an aqueous alkali developer solution, the refractive index of the first resin layer is 1.60 to 1.78, and the film thickness of the first resin layer is 55 nm to 110 nm, wherein the photosensitive laminate is obtained by:

(1) providing a transfer material, comprising:

a temporary support; and the second resin layer, the interlayer, and the first resin layer which are laminated on the temporary support in this order, and (2) transferring the transfer material onto the support such that the first resin layer is on the support side and removing the temporary support.

* * * * *